(12) United States Patent
Low et al.

(10) Patent No.: US 9,769,970 B2
(45) Date of Patent: Sep. 19, 2017

(54) APPARATUS AND METHOD FOR FEEDING ELECTRONIC COMPONENTS FOR INSERTION ONTO CIRCUIT BOARDS

(71) Applicant: Panasonic Factory Solutions Asia Pacific, Singapore (SG)

(72) Inventors: Mun Ji Low, Singapore (SG); Xiao Wang, Singapore (SG); Poh Hwee William Chua, Singapore (SG); Kim Sui Wong, Singapore (SG); Guanghui Yang, Singapore (SG)

(73) Assignee: Panasonic Factory Solutions Asia Pacific, Singapore (SG)

( * ) Notice: Subject to any disclaimer, the term of this patent is extended or adjusted under 35 U.S.C. 154(b) by 0 days.

(21) Appl. No.: 14/971,380

(22) Filed: Dec. 16, 2015

(65) Prior Publication Data

US 2017/0181342 A1    Jun. 22, 2017

(51) Int. Cl.
| | |
|---|---|
| *B07C 5/08* | (2006.01) |
| *H05K 13/04* | (2006.01) |
| *B07C 5/344* | (2006.01) |
| *B07C 1/06* | (2006.01) |
| *G01V 8/12* | (2006.01) |
| *H05K 13/08* | (2006.01) |
| *H05K 13/02* | (2006.01) |
| *H01L 21/67* | (2006.01) |
| *H05K 1/18* | (2006.01) |

(52) U.S. Cl.
CPC .......... *H05K 13/0417* (2013.01); *B07C 1/06* (2013.01); *B07C 5/344* (2013.01); *G01V 8/12* (2013.01); *H01L 21/67271* (2013.01); *H05K 13/02* (2013.01); *H05K 13/022* (2013.01); *H05K 13/08* (2013.01); *H05K 1/181* (2013.01); *H05K 2201/10106* (2013.01)

(58) Field of Classification Search
CPC ...... H05K 13/02; H05K 13/08; H05K 13/022; H05K 13/0417; B07C 5/00; B07C 5/02; B07C 5/08; B07C 5/344
USPC ................. 209/571, 572, 573, 659
See application file for complete search history.

(56) References Cited

U.S. PATENT DOCUMENTS 2,858,930 A * 11/1958 Aidlin ............... B65G 47/1421
                                                              193/44
3,106,281 A * 10/1963 Mottin ............... B65G 47/1471
                                                              198/399

(Continued)

*Primary Examiner* — Terrell Matthews
(74) *Attorney, Agent, or Firm* — Schwegman Lundberg & Woessner, P.A.

(57) ABSTRACT

An apparatus and method for feeding electronic components for insertion onto circuit boards, the apparatus comprising: a vibratory bowl configured for receiving electronic components and for lining up the electronic components onto a moveable conveyor, the vibratory bowl is configured for vibrating and guiding each of the electronic components towards an opening in the vibratory bowl where each of the electronic components is transferred to the conveyor; a component processing unit configured for checking operation of each of the electronic components lined up along the conveyor and for removing any defective electronic component failing the operation check; and a component feeder configured for transferring each of the electronic components that are non-defective to a machine for handling insertion of the electronic components onto circuit boards.

38 Claims, 19 Drawing Sheets

(56) References Cited

U.S. PATENT DOCUMENTS

| | | | | |
|---|---|---|---|---|
| 4,067,147 A * | 1/1978 | Leliaert | ............ | B24B 31/073 451/32 |
| 4,354,618 A * | 10/1982 | Weyandt | ............ | B65G 27/02 198/753 |
| 4,745,679 A * | 5/1988 | Shinano | ............ | H05K 13/0452 29/741 |
| 4,810,154 A * | 3/1989 | Klemmer | ............ | H05K 13/0417 414/222.02 |
| 4,910,859 A * | 3/1990 | Holcomb | ............ | B23P 19/006 140/147 |
| 4,976,356 A * | 12/1990 | Mizuno | ............ | B07C 5/02 198/345.1 |
| 5,314,055 A * | 5/1994 | Gordon | ............ | B25J 9/1697 198/395 |
| 5,898,983 A * | 5/1999 | Sooy | ............ | H05K 13/0473 29/33 M |
| 6,289,582 B1 * | 9/2001 | Maenishi | ............ | H05K 13/08 29/564.1 |
| 6,918,730 B2 * | 7/2005 | Kawai | ............ | H05K 13/0417 414/183 |
| 7,017,731 B2 * | 3/2006 | Ikeda | ............ | H05K 13/028 198/464.2 |
| 7,973,259 B2 * | 7/2011 | Tsai | ............ | G01R 31/2893 209/556 |
| 2004/0159591 A1 * | 8/2004 | Kojima | ............ | B07C 5/344 209/571 |
| 2015/0237740 A1 * | 8/2015 | Nozawa | ............ | H05K 3/301 29/739 |
| 2016/0120037 A1 * | 4/2016 | Kadota | ............ | H05K 13/0417 29/739 |

* cited by examiner

APPARATUS AND METHOD FOR FEEDING ELECTRONIC COMPONENTS FOR INSERTION ONTO CIRCUIT BOARDS

FIELD

The present invention relates to an apparatus and method for feeding electronic components for insertion onto circuit boards.

BACKGROUND

Existing auto-insertion equipment for inserting radial lead electronic components onto a circuit board includes a High-speed Radial Lead Component Insertion Machine, RL132, made by Panasonic.

As shown in FIG. 1, RL132 100, is applicable for electronic components with dimensions ranging from pitch 2.5/5.0 mm (standard) to 7.5 mm and 10 mm (as options). The type of components supported by the RL132 can be a resistor, Electrolytic capacitor, Ceramic capacitor, Light Emitting Diode (LED), Transistor, Filter, etc. However, a limitation of this machine is that the insertion components need to be packed onto a reel, an ammo box and fed in tape form. FIG. 1 shows a structure 102 fixed to the RL132 100 for feeding insertion components via conventional manner.

SUMMARY

In accordance with an aspect of an example of the present disclosure, there is provided an apparatus for feeding electronic components for insertion onto circuit boards, the apparatus comprising: a vibratory bowl configured for receiving electronic components and for lining up the electronic components onto a moveable conveyor, the vibratory bowl is configured for vibrating and guiding each of the electronic components towards an opening in the vibratory bowl where each of the electronic components is transferred to the conveyor; a component processing unit configured for checking operation of each of the electronic components lined up along the conveyor and for removing any defective electronic component failing the operation check; and a component feeder configured for transferring each of the electronic components that are non-defective to a machine for handling insertion of the electronic components onto circuit boards.

In accordance with another aspect of an example of the present disclosure, there is provided a method for feeding electronic components for insertion onto circuit boards, the method comprising: receiving electronic components into a vibratory bowl; vibrating the vibratory bowl to guide each of the electronic components towards an opening in the vibratory bowl; lining up the electronic components from the opening onto a moveable conveyor; checking operation of each of the electronic components lined up along the conveyor; removing any defective electronic component failing the operation check; and transferring each of the electronic components that are non-defective to a machine for handling insertion of the electronic components onto circuit boards.

BRIEF DESCRIPTION OF THE DRAWINGS

Various embodiments of the present disclosure will now be described, by way of example only, and with reference to the accompanying drawings in which.

DETAILED DESCRIPTION

Figure 2:
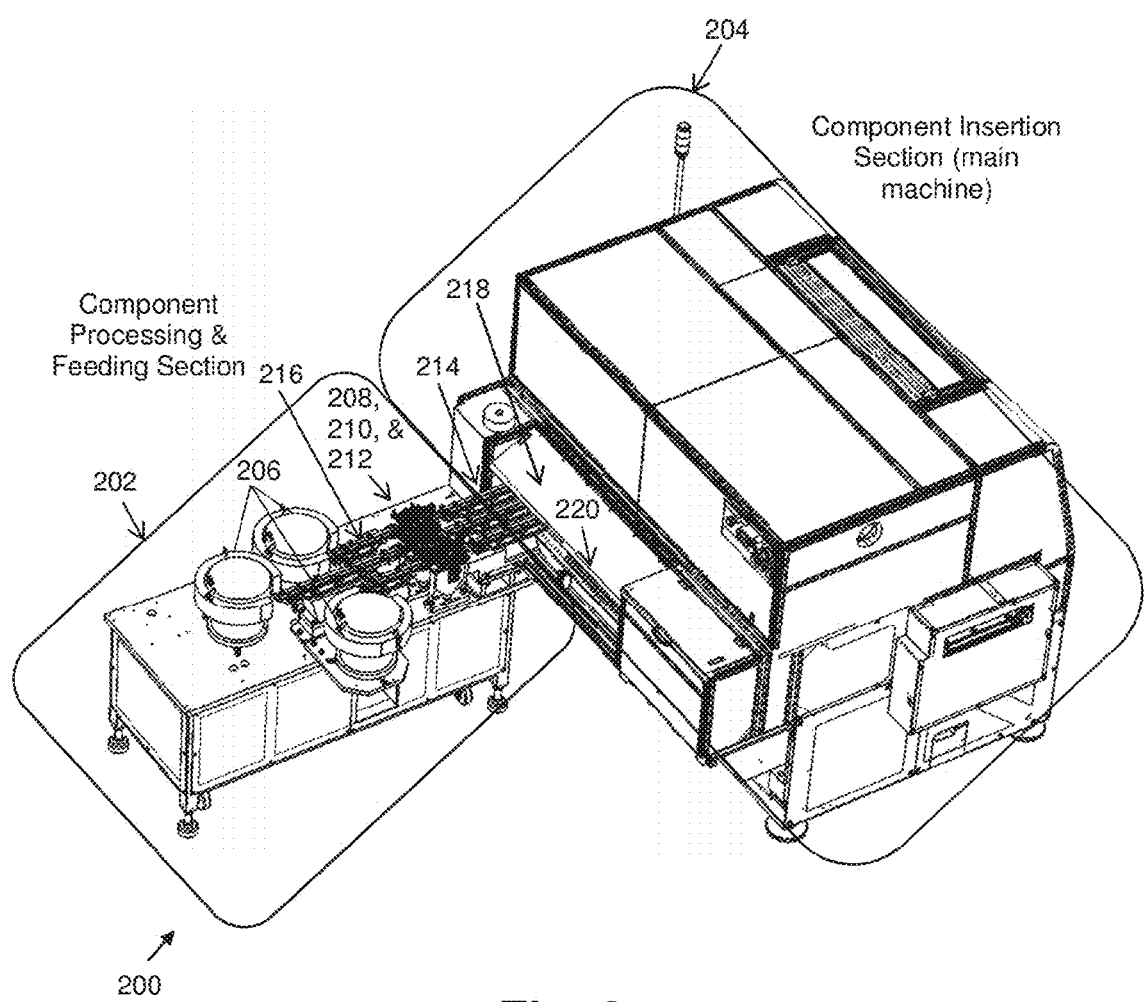
FIG. 2 is a perspective view of a first example machine of the present disclosure.

With reference to FIG. 2, a first example of the present disclosure is an apparatus that is an automatic Light Emitting Diode (LED) insertion machine 200 (hereinafter "first example machine"). The first example machine 200 is capable of organizing and arranging a plurality of loose LED components, and inserting them onto a circuit board such as a Printed Circuit Board (PCB). It is appreciated that other examples of the insertion machine of the present disclosure having similar features can also automatically insert other types of electronic components besides LED components such as Resistor, Electrolytic Capacitor, Ceramic Capacitor, Transistor, Filter, etc.

"LED components" and "LEDs" are used interchangeably in the present disclosure.

Figure 25:
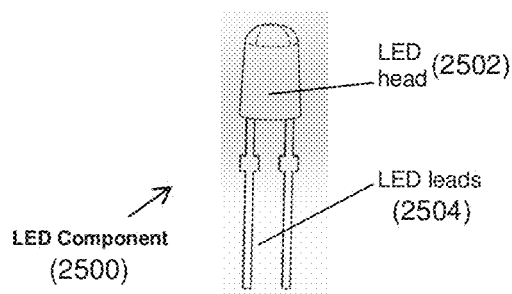
FIG. 25 is a drawing of an LED component.

With reference to FIG. 25, an LED component 2500 comprises a pair of LED leads 2504 attached to an LED head 2502. The LED head 2502 lights up when electrical power is supplied to it. The LED leads 2504 comprise a positive polarity lead and a negative polarity lead for supplying the electrical power to the LED head 2502.

As shown in FIG. 2, the first example machine 200 comprises a component processing and feeding section 202 which includes
- a plurality of vibratory bowls 206 to facilitate lining up of LED components for further processing, which includes features for filtering out defective shaped LED components, and orientating the LED components in a line to facilitate further component processing,
- a linear feeder unit 208 attached to each of the plurality of vibratory bowls 206,
- a component processing unit 210 attached to each linear feeder unit 208 for checking, carrying out rotation to correct lead polarities orientation of the LED components to obtain LED components with the same orientation in a line and rejecting Not Good (NG) components,
- a buffer linear feeder 212 attached to each component processing unit 210 for queuing the LED components, and
- a component feeder 218 (also called a loose LED Feeder; not visible in FIG. 2 and covered by chassis of a component insertion section 204) attached to each buffer linear feeder 212 for feeding the LED components one by one to a pallet (not shown in FIG. 2, covered by a chassis of the component insertion section 204) in the component insertion section 204. More details on the pallet will be provided later.

It is appreciated that although a plurality of vibratory bowls 206 are disclosed, the first example machine 200 can operate with at least one vibratory bowl 206.

The component insertion section 204 is a machine for handling insertion of the electronic components onto the circuit board. More specifically, in this example, the component insertion section 204 is for carrying out insertion of the LED components onto PCBs and the component insertion section 204 includes:
- a sequencing system (not visible in FIG. 2) for capturing a LED component and delivering it to the pallet in a predetermined sequence,
- a component positioning system (not visible in FIG. 2) for detecting components on the pallet, adjusting LED components to suitable height, lead distance and position, and cutting excessive lead,
- a component insertion, cut & clinch system (not visible in FIG. 2) for transferring, inserting components into PCB, and cutting and clinching the LED leads,
- a PCB transferring system (not visible in FIG. 2) for loading and unloading PCBs, and locating PCBs to an insertion area, and
- a "X-Y" component transfer system (not visible in FIG. 2) for carrying and moving PCB during the insertion process.

Figure 1:
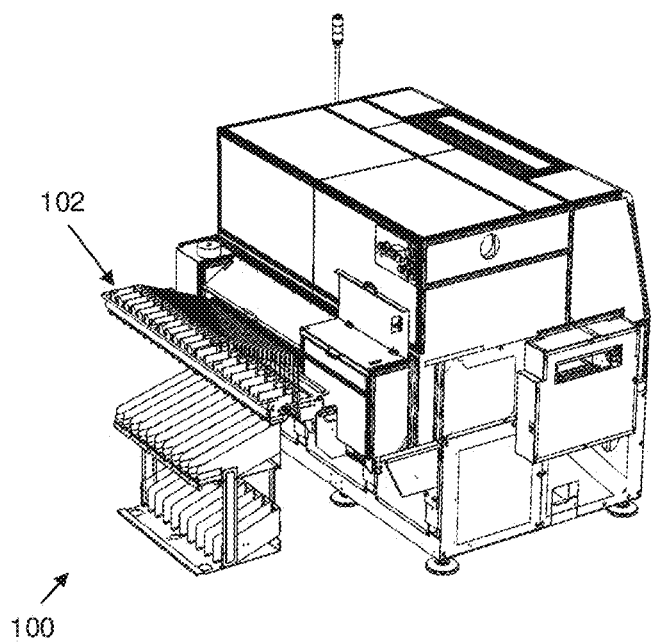
FIG. 1 is a perspective view of a conventional High-speed Radial Lead Component Insertion Machine, RL132.

Furthermore, the component insertion section 204 comprises a taped component feeder 220 for receiving components packaged on a tape. This is one way conventional component insertion machines receives components for insertion onto PCBs. A structure for feeding components such as the structure 102 of FIG. 1 is attachable to the taped component feeder 220. Advantageously, the first example machine 200 is capable of receiving components packaged on a tape and the like and receiving components from the component processing and feeding section 202 as described. In the present example, either "loose form" components processed by the component processing and feeding section 202 or taped form components fed from a structure such as the structure 102 in FIG. 1 are fed to the component insertion section 204 at any one time. However, it is appreciated that suitable modifications can be made to enable the component insertion section 204 to receive both "loose form" components and taped form components and the like at any one time.

Figure 3:
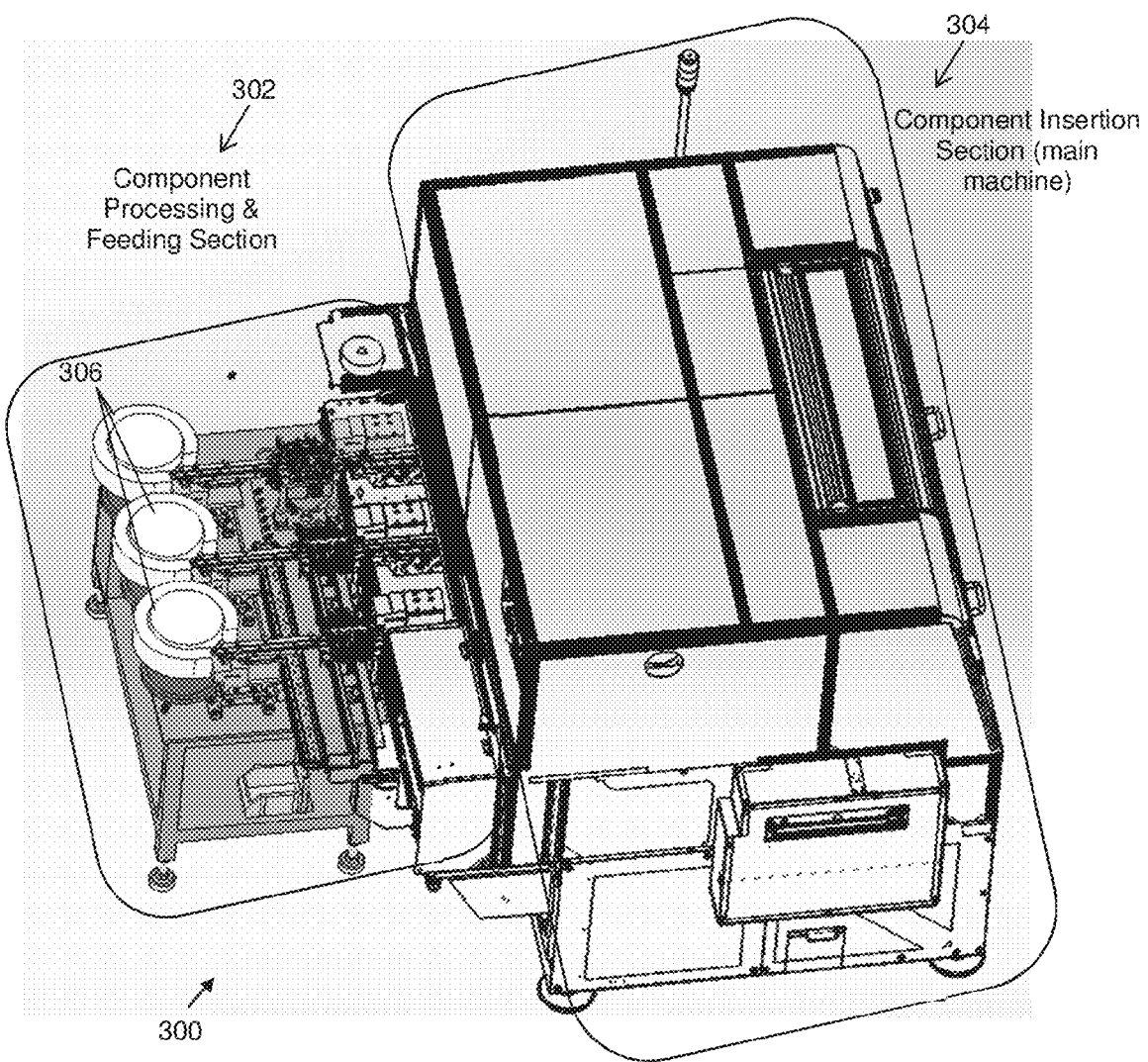
FIG. 3 is a perspective view of a second example machine of the present disclosure.

FIG. 3 shows a second example machine 300. The second example machine 300 comprises a component insertion section (also known as a main machine) 304 exactly the same as the component insertion section 204 of the first example machine 200. The second example machine 300 comprises a component processing and feeding section 302 that operates in a similar manner as the component processing and feeding section 202 of the first example machine 200. However, there are some differences between the component processing and feeding section 302 and the component processing and feeding section 202. More details on the differences will be discussed later.

With reference to FIG. 2, the first example machine 200 is characterized by an ability to feed loose LED components as well as taped components into the component insertion section 204. Key innovations reside in the components processing and feeding section 202.

Instead of feeding taped components through a typical "piano shaped" guiding system from a parts box, for example, the structure 102 in FIG. 1, the first example machine 200 uses the plurality of vibratory bowls 206 coupled to each linear feeder unit 208 to sequence loose LED components in line. The linear feeder unit 208 comprises a first moveable conveyor 216 (also known herein as a primary rail or first conveyor) for transferring the LED components. Thereafter, the component processing unit 210 performs checking of lead polarities of each LED component, rotating of any LED component not having a predetermined desired lead polarity orientation and filtering out NG LED components. The LED components are then transferred to the buffer linear feeder 212. The buffer linear feeder comprises a second moveable conveyor (also known herein as a buffer rail, second conveyor, or a secondary rail) 214. The LED components wait on the second moveable conveyor to be fed to the component insertion section 204 through a loose components feeder, which is the component feeder 218, to the pallet in the component insertion section 204.

Specifically, each of 3 sets of the following devices, one of the vibratory bowls 206, the linear feeder unit 208, the first moveable conveyor 216, the component processing unit 210, the buffer linear feeder 212, the second moveable conveyor (or buffer rail) 214, and the component feeder 218 are present in the first example machine 200. In the process of the present example, 3 different colors of loose LED components are processed simultaneously. Each set of the aforementioned devices handles LED components of a different color from that of another set. In this manner, advantageously, different types of components can be handled by each set of the devices, for example, when there are 3 sets of the aforementioned devices, a resistor, a capacitor and an LED can be handled by the 3 sets of the aforementioned devices respectively. In the present disclosure, the same insertion components having different colors such as different color LEDs are also referred as different types of components.

With reference to FIG. 2 and FIG. 3, the second example machine 300 is an enhancement of the first example machine 200, with improvement mainly at the components processing and feeding section 302. In the second example machine 300, the buffer linear feeder 212 has been moved to the side of the component insertion section 304 (main machine) and the taped component feeder 220 of the first example machine has been removed. By doing so, it provides ease of connection of the component processing and feeding section 302 to the component insertion section 304 (main machine), reducing assembly time and cost. The second example machine 300 is also more compact as a plurality of vibratory bowls 306 of the second example machine 300 corresponding to the plurality of vibratory bowls 206 of the first example machine 200 are arranged in a row and located adjacent to one another, thus taking up lesser space compared to the arrangement of the vibratory bowls 206 of the first example machine 200, which are not arranged in a row. The taped component feeder 220 is removed to make space for the buffer linear feeder 212.

At least one of the component feeder 218 in FIG. 2 is also present in the second example machine 300. In both cases of the first example machine 200 and the second example machine 300, the component feeder resides in the component insertion section 204 (main machine) and the component insertion section 304 (main machine) respectively.

Figure 4:
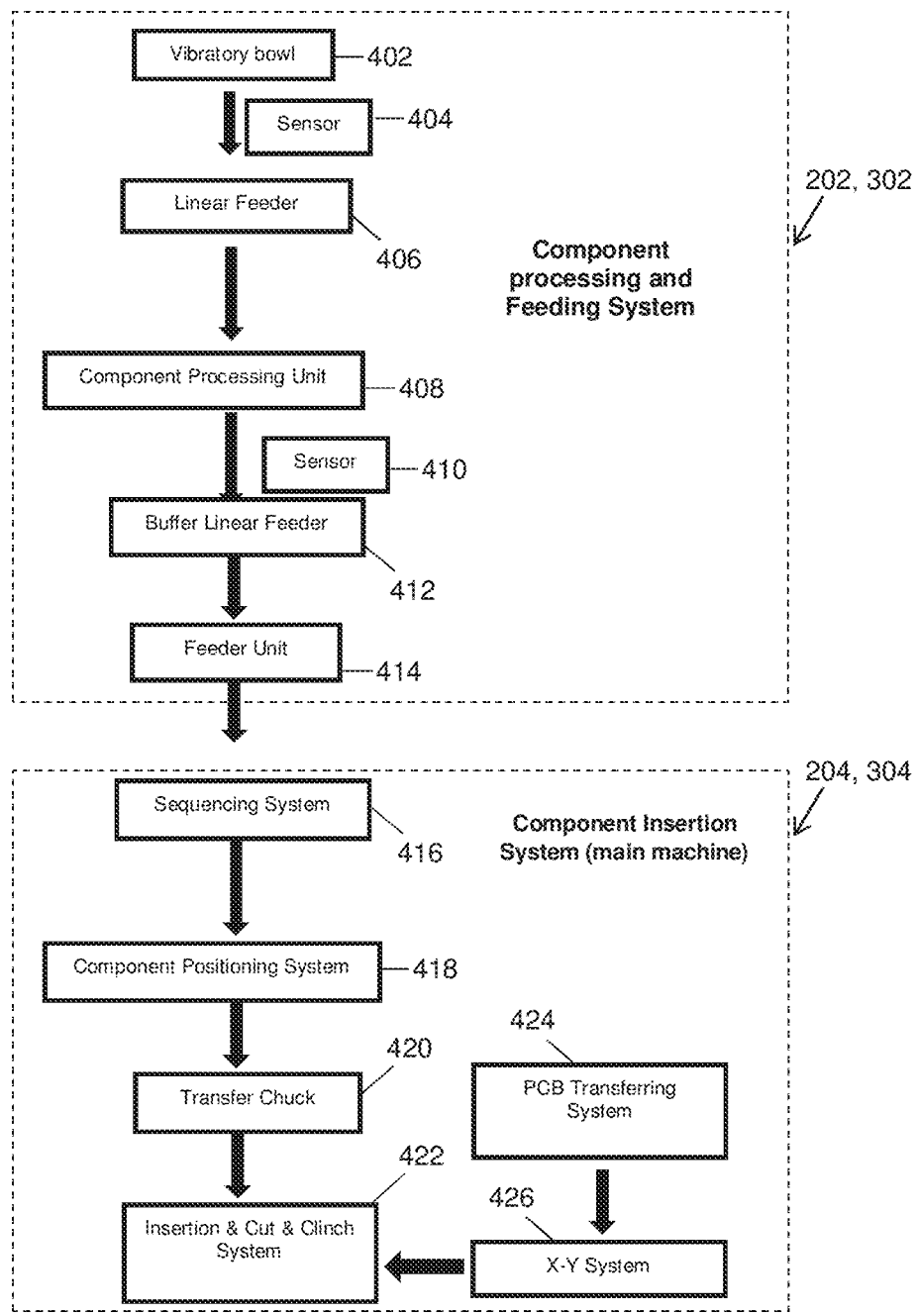
FIG. 4 is a flow chart illustrating a Light Emitting Diode (LED) component insertion process.

FIG. 4 demonstrates flow of the loose LED components insertion process carried out by both the first example machine 200 of FIG. 2 and the second example machine 300 of FIG. 3. The LED components are transferred step by step as follows.

At step 402, a vibratory bowl filters out non-defective LEDs that are non-defective in terms of shape and size.

At step 404, the LEDs passes a sensor for detecting whether to accept more LEDs coming from the vibratory bowl or to pause sending of more LEDs from the vibratory bowl by pausing its operation.

At step 406, the LEDs are lined up on a primary rail of a linear feeder for transferring to a component processing unit.

At step 408, the LEDs are transferred to the component processing unit for checking polarities of the LEDs to see if they are electrically defective and to orientate them to a predetermined orientation if they are not already in the predetermined orientation.

At step 410, the LEDs passes a sensor for detecting whether to accept more LEDs coming from the component processing unit or to pause sending of more LEDs from the component processing unit by pausing its operation.

At step 412, the LEDs are lined up on a secondary rail of a buffer linear feeder for transferring to a component feeder.

At step 414, the LEDs are fed by the component feeder to a pallet.

Steps 402 to 414 are steps taken by the component processing and feeding system 202 in FIG. 2 and 302 in FIG. 3.

At step 416, the LEDs are captured and delivered to the pallet in a predetermined sequence through a sequencing system.

At step 418, the LEDs on the pallet are adjusted to suitable height, lead distance and position, and excessive leads length is cut by a component positioning system.

At step 420, the LEDs are transferred by a transfer chuck one by one to an insertion area.

At step 422, at the insertion area, the LEDs are inserted onto a PCB, followed by cutting and clinching of the LED leads by a component insertion, cut & clinch system.

At step 424, incomplete PCBs are loaded into the insertion area and completed PCB are unloaded by a PCB transferring system.

At step 426, the incomplete PCBs in the insertion area is moved by a X-Y system to enable the LEDs to be inserted onto the incomplete PCBs.

Steps 416 to 426 are steps taken by the component insertion system 204 in FIG. 2 and 304 in FIG. 3.

Figure 6:
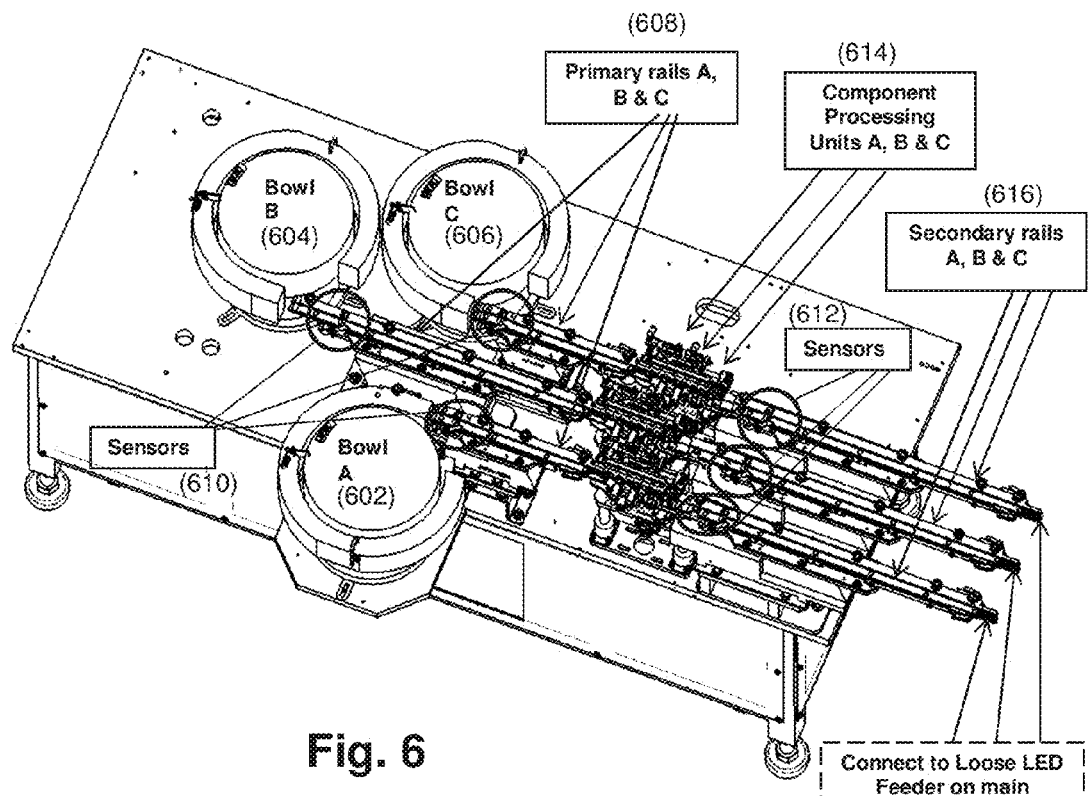
FIG. 6 is a trimetric view of the vibratory bowls, primary rails, component processing units, sensors and secondary rails of the first example machine.

With reference to FIG. 2 and FIG. 6, specifically, the first example machine 200 comprises 3 vibratory bowls 206, each driven by a piezoelectric bowl feeder. The 3 vibratory bowls are identified as bowl A 602, bowl B 604 and bowl C 606 in FIG. 6. 3 primary rails 608 (i.e. first moveable conveyors 216) of the linear feeder unit 208, namely primary rail A, primary rail B, and primary rail C, are in parallel arrangement with one another. One end of each of the 3 primary rails A, B and C 608 is connected to the bowls A, B, and C respectively. Each of the 3 primary rails A, B, and C 608, is driven by a piezoelectric linear feeder. Another end of each of the 3 primary rails A, B and C 608 is connected to each of 3 corresponding component processing units A, B & C 614 respectively. 3 secondary rails 616 (i.e. second moveable conveyors 214) of the buffer linear feeder 212, namely secondary rail A, secondary rail B, and secondary rail C, are in parallel arrangement with one another. One end of each of the 3 secondary rails A, B and C 616 is connected to each end of the 3 component processing units A, B and C 614 respectively. Each of the 3 secondary rails A, B, and C 616, is also driven by a piezoelectric linear feeder. Another end of each of the 3 secondary rails A, B and C 616 is connected to a loose LED Feeder 618, which is the component feeder 218 in FIG. 2. The loose LED Feeder 618 resides on the component insertion section 204. It is appreciated that the 3 primary rails 608 and the 3 secondary rails 616 could be driven by the same piezoelectric linear feeder or different piezoelectric linear feeders.

A piezoelectric feeder described herein such as the piezoelectric bowl feeder and piezoelectric linear feeder may include a base, a plurality of amplifying springs, with a lower end portion of each of the plurality of amplifying springs being secured to the base. A working mass member is connected to an upper end portion of each of the plurality of amplifying springs and supported at the base to enable the working mass member to vibrate. The piezoelectric feeder also includes a piezoelectric device bonded to at least one surface of each of the plurality of amplifying springs. An alternating voltage is applied to each piezoelectric device whereby each amplifying spring undergoes bending vibration and causes the working mass member to vibrate so that an object is transported on the working mass member.

The first example machine 200 is capable of processing LED components in 3 colors simultaneously with the 3 separate sets of devices. The first set being the bowl A 602, the primary rail A of the primary rails 608, the component processing unit A of the component processing units 614, and the secondary rail A of the secondary rails 616. The second set being the bowl B 604, the primary rail B of the primary rails 608, the component processing unit B of the component processing units 614, and the secondary rail B of the secondary rails 616. The third set being the bowl C 606, the primary rail C of the primary rails 608, the component processing unit C of the component processing units 614, and the secondary rail C of the secondary rails 616. As mentioned earlier, each set of devices handles a LED component with color different from the color of another LED component handled by another set of components. There are 3 sensors 610 (all circled out in FIG. 6) mounted on each of the primary rails 608 A, B and C respectively and there are 3 sensors 612 (all circled out in FIG. 6) mounted on each of the secondary rails 616 A, B and C respectively. Each of the 6 sensors 610 and 612 includes a beam emitter for emitting a beam and a beam receiver for receiving the emitted beam. More details on the sensors 610 and 612 would be discussed later.

Figure 7:
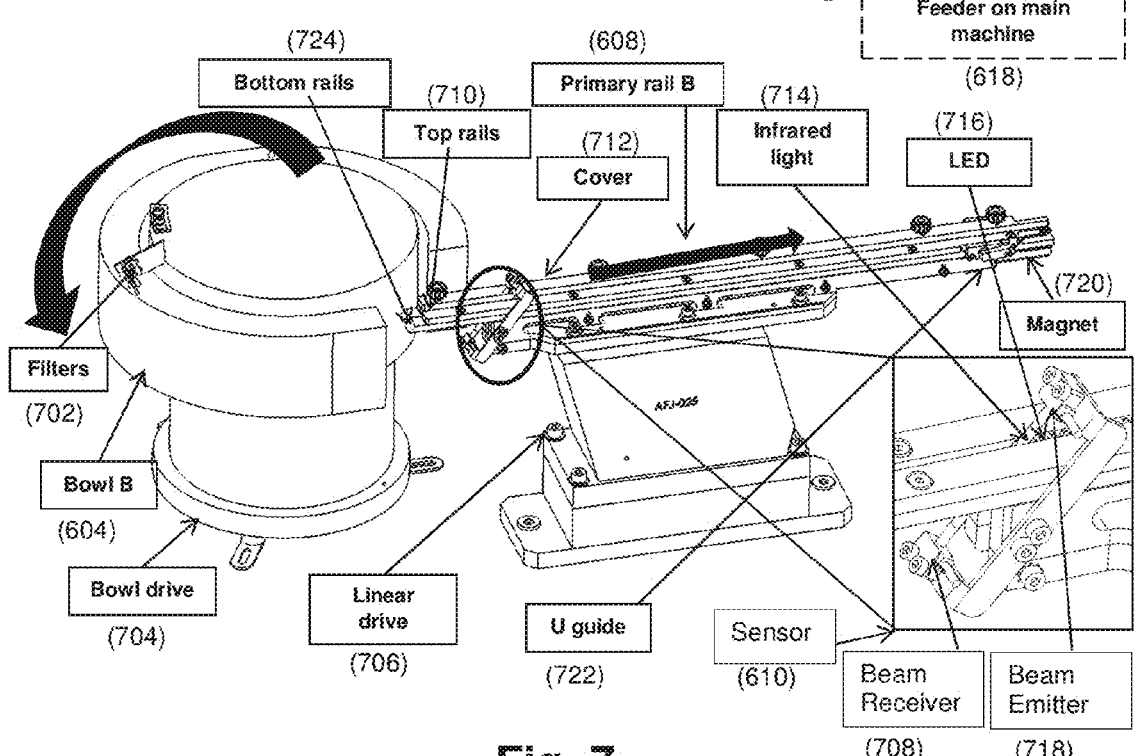
FIG. 7 shows a vibratory bowl, a primary rail and a sensor of the vibratory bowl.

FIG. 7 illustrates some devices in each set of the 3 sets of devices in FIG. 6 in more detail. FIG. 7 shows the vibratory bowl B 604, the primary rail B of the primary rails 608 and one of the 3 sensors 610. It is appreciated that each set of these devices have the same configuration and elements.

Filters 702 of the vibratory bowl B 604 shown in FIG. 7 are meant for filtering non-defective LEDs in the bowl B 604 so that only non-defective LEDs will be transferred to the primary rail B 608. More details on the Filters 702 will be discussed later.

The primary rail B 608 is connected to the vibratory bowl B 604. The primary rail B 608 includes
  a pair of top rails 710 for receiving non-defective LEDs filtered out from the vibratory bowl B 604 and, specifically, for guiding the LED heads of the LEDs 716,
  a pair of bottom rails 724 for receiving non-defective LEDs filtered out from the vibratory bowl B 604 and, specifically, for sitting the LED leads of the LEDs 716,
  a cover 712 acting like a fence for preventing LEDs 716 from falling off from the primary rail B 608,
  a magnet 720 located on a U guide 722 right beneath the primary rail B 608 exerting magnetic force to maintain the LEDs 716 in an orientation such that the LED leads of the LEDs 716 are pointing downwards and the LED heads of the LEDs 716 are pointing upwards, the U guide is for connecting a linear drive 706 to the pair of top rails 710 and the pair of bottom rails 724 to enable vibrations from the linear drive 706 to move the LEDs 716 along the pair of top rails 710 and the pair of bottom rails 724,
  one of the sensors 610 for helping in the buffering of components before a next process is activated to receive more LEDs on the primary rail B 608 and feed them to the component processing unit B 614, which is not shown in FIG. 7, and
  a stopper (not shown in FIG. 7) near the magnet 720, the stopper is configured for holding the LEDs 716 to prevent them from falling off the rails, which refer to the pair of top rails 710 and the pair of bottom rails 724, so that transfer clamps of the component processing unit B of the component processing units (614 in FIG. 6) can pick up the LEDs 716 one by one and proceed with LED polarity checking.

Shown in FIG. 6 but not in FIG. 7, the secondary rail B 616 is connected to the component processing unit 614. The secondary rail B 616 includes similar features as that of the primary rail B 608, namely,
  a pair of top rails similar to the top rails 710,
  a pair of bottom rails similar to the bottom rails 724,
  a cover similar to the cover 712,
  a magnet similar to the magnet 720,
  one of the sensors 612 for helping in the buffering of components before a next process is activated to receive more LEDs on the secondary rail B 616 and to feed them to the component feeder 218 in FIG. 2.

Referring back to FIG. 7, the sensor 610 is mounted on the primary rail B 608 at a location closer to the vibratory bowl B 604 than to the component processing unit B 614. The sensor 610 includes a beam emitter 708 for emitting a beam and a beam receiver 718 for receiving the emitted beam. In this case, the emitted beam is an infrared light 714. The beam emitter 708 and the beam receiver 718 are mounted on the primary rail B 608 such that the beam emitter 708 and the beam receiver 718 are facing each other. More details of the sensor 610 will be described later.

In a zoom in drawing of the sensor 610 shown in FIG. 7, LEDs 716 are shown to be disposed along the top rails 710 and being moved towards the component processing unit B 614 (not shown in FIG. 7). The LEDs 716 may get in the way of the infrared light 714 and that may cause the sensor 610 to trigger a signal for certain action. Details of the sensor 610 will be discussed later.

Below the vibratory bowl B 604 is a bowl drive 704, which is in this case is the piezoelectric bowl feeder mentioned earlier. Below the primary rail B 608 is the linear drive 706, which is in this case the piezoelectric linear feeder mentioned earlier. Although the vibratory drive for both the bowl drive 704 and linear drive 706 are in disclosed as piezoelectric based, it is appreciated that they can be replaced by non-piezoelectric based vibrators, which are less sensitive to input voltage and frequency, to make the system less affected by such sensitivities. As an example, the linear drive may vibrate at a certain frequency, 158 Hz for the primary rail A of the primary rails 608, 111 Hz for the primary rail B of the primary rails 608 and 120 Hz for the primary rail C of the primary rails 608 for driving the LEDs (e.g. 716 for primary rails B 608) delivered thereon forward. The difference in the frequencies is due to consideration of the different lengths of the primary rails 608 and the synchronization to be achieved for the LEDs to be delivered to the component processing unit B 614.

The connecting gaps between the primary rail B 208 and the bowl B 604, the gap between the pair of top rails 710 and bottom rails (not shown in FIG. 7) and the height of the U guide located right beneath the primary rail 208 B are not fixed. These parameters vary depending on size of the components, in this case the LEDs, required to be transferred.

Figure 8:
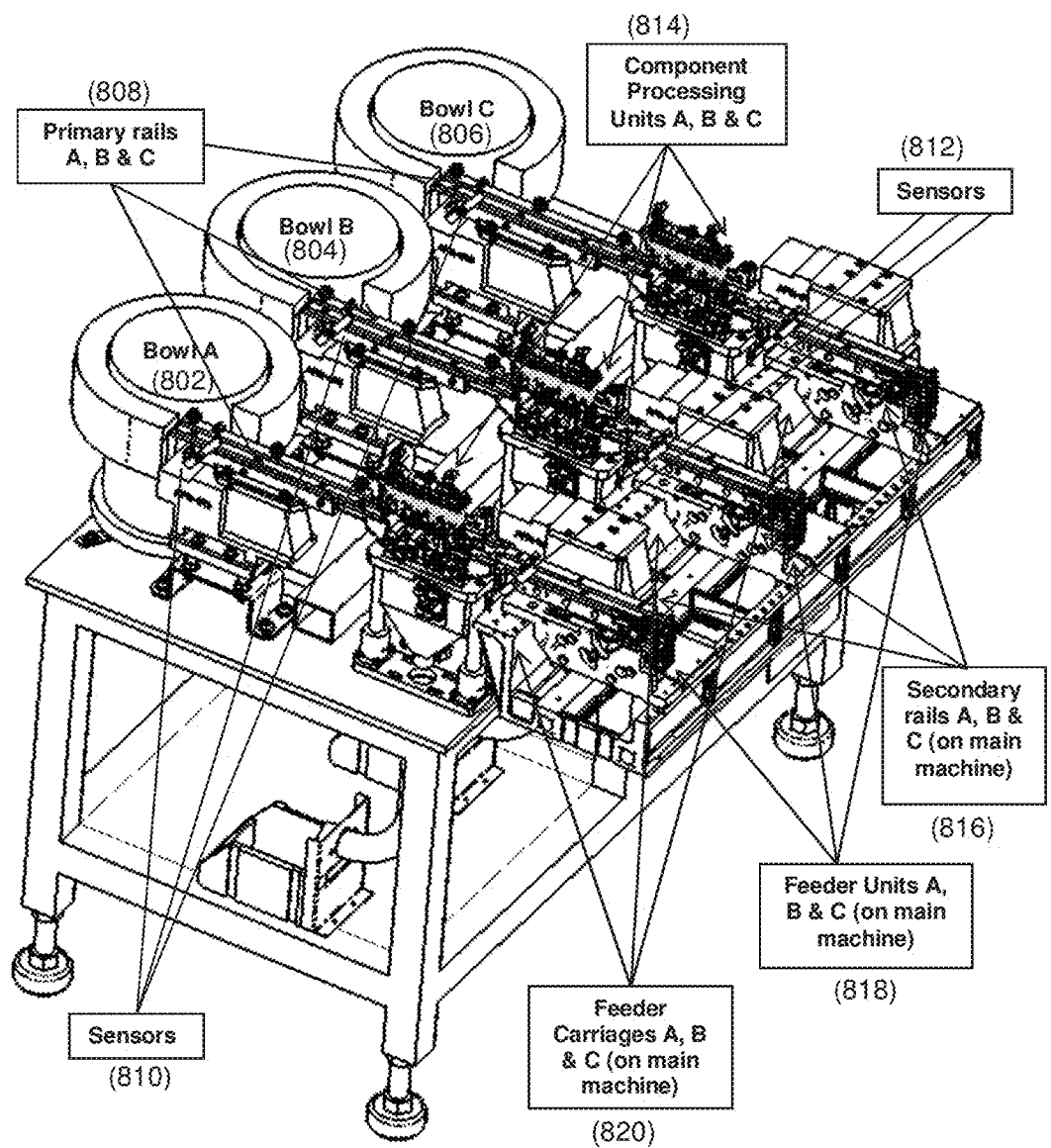
FIG. 8 is a trimetric view of the vibratory bowls, primary rails, component processing units, sensors and secondary rails of the second example machine.

FIG. 8 shows the same devices of the components processing and feeding section 302 in FIG. 3 as that of the devices shown in FIG. 6 of the components processing and feeding section 202 in FIG. 2. The operation and functionalities of the common devices are the same. However, the devices of the components processing and feeding section 302 in FIG. 3 are arranged differently compared to the devices of the components processing and feeding section 202 in FIG. 2. The vibratory bowls A 802, B 804 and C 806 have the same features and operate the same as the vibratory bowls A 602, B 604, and C 606 respectively. The primary rails 808 A, B, and C have the same features and operate the same as the primary rails 608, A, B and C respectively. The component processing units 814 A, B and C have the same features and operate the same as the component processing units 614 A, B and C respectively. The secondary rails 816 A, B and C have the same features and operate the same as the secondary rails 616 A, B and C respectively. The sensors 810 have the same features and operate the same as the sensors 610 respectively and the sensors 812 have the same features and operate the same as the sensors 612 respectively.

A key difference between the components processing and feeding section 302 illustrated in FIG. 8 and the components processing and feeding section 202 illustrated in FIG. 6 is that the secondary rails 816 A, B and C are located on the component insertion section (main machine) 304 of the second example machine 300 whereas the secondary rails 616 A, B and C reside outside the component insertion section (main machine) 204 of the first example machine 200.

Furthermore, the vibratory bowls A 802, B 804 and C 806 are arranged in a row and located adjacent to one another. Similarly, the primary rails 808 A, B, and C, the component processing units 814 A, B and C and the secondary rails 816 A, B and C are arranged in a row and located adjacent to one another.

There are 3 component feeders 818 A, B and C connected to each of the secondary rails 816 A, B and C respectively. These 3 component feeders 818 A, B and C resides in the component insertion section (main machine) 304 of the second example machine 300. Each of these component feeders 818 A, B and C has the same function as the component feeder 218 in FIG. 2 described earlier. There is one corresponding feeder carriage 820 supporting the secondary rails 816 A, B and C and the 3 component feeders 818 A, B and C respectively.

Vibratory Bowl

With reference to FIG. 6, the piezoelectric bowl feeder vibrates each of the vibratory bowls A 602, B 604, and C 606 at a certain frequency around 120±10 Hz. This frequency is set based on size and weight of each of the vibratory bowls A 602, B 604 and C 606 respectively. Vibration of the vibratory bowls A 602, B 604 and C 606 comes from the respective bowl drives, for instance, the bowl drive 704 in FIG. 7 drives vibratory bowl 604. The vibratory bowl 604 is like a load for the bowl drive 704, similar to the relationship between the rails and the linear drive, for instance, the top rails 710 and Primary rail B 608 and the linear drive 706. According to the load, which is defined mainly by weight and size, the bowl drive 704 or linear drive 706 needs to exert a certain voltage and frequency to generate an optimal vibration to drive the LED components in the Bowl B 604 or on the rails 710 and 608. The optimal frequency and voltage is obtained by actual testing and experimentation for specifically designed bowl or rails. Due to the vibrations, loose LED components fed into each bowl A 602, B 604, and C 606 climb upwards along a spiral track in each of the bowls A 602, B 604, and C 606. Components with odd lead shapes are swept out upon reaching top of the bowls A 602, B 604, and C 606. Non-defective ones pass through tracks residing in each of the bowls A 602, B 604, and C 606 that are attached to the primary rails. The Non-defective LEDs move along the tracks to the primary rails with LED leads pointing downwards and LED heads pointing upwards. Although not shown in the Figures, the piezoelectric bowl feeder is connected to a processor, which controls and monitors the operation of the piezoelectric bowl feeder.

Figure 31:
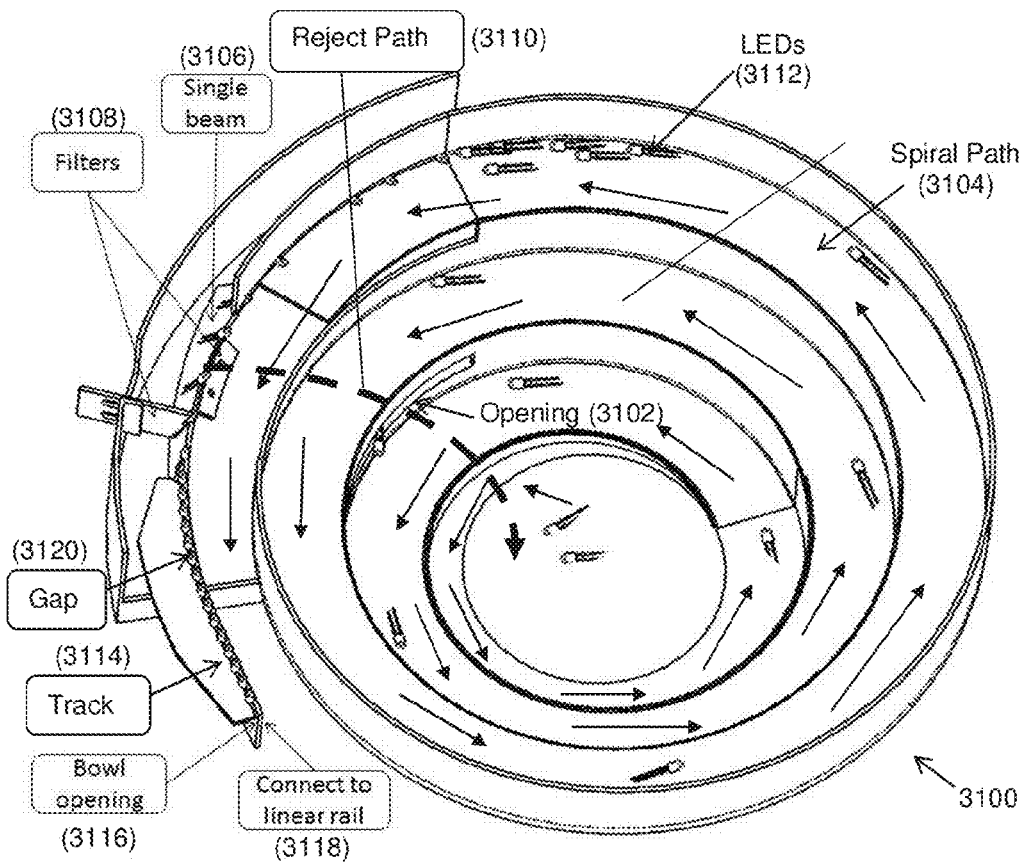
FIG. 31 illustrates a vibratory bowl in the first and second example machines.

FIG. 31 illustrates interior of a bowl 3100, showing in more detail how LEDs 3112 may move in each of the vibratory bowls A 602, B 604, and C 606 when the piezoelectric bowl feeder is activated. The bowl 3100 has a plurality of levels for moving LEDs 3112 to climb. LEDs are fed into the bowl 3100 in loose form by a user or an operator manually and refilled when the bowl 3100 is running empty. An opening 3102 is located at a second level of the bowl 3100. The opening 3102 is where defective shaped LED components flow or are swept into a collection point for recycling. Lower than the second level is a first level of the bowl 3100, which is the lowest level in the bowl 3100. LED components 3112 move along a spiral or helical path 3104 (illustrated by arrows in FIG. 31) to a top of the bowl 3100 (highest level) where there are two filters 3108 for filtering the LED components 3112. Only LEDs 3112 with suitable shapes, postures or orientations are allowed to pass by the filters 3108 and those with wrong shapes, postures or orientations will drop into the bowl 3100 via a reject path 3110 and recycled. The LEDs 3112 are moved pass the filters 3108 disposed along a single beam 3106 and are being lined up and lead by a track 3114 towards a bowl opening 3116, which is to be connected to the linear rail or the primary rail 3118. The track 3114 is configured such that there is a gap 3120 where only the LED leads of the LEDs 3112 fits and the LED heads of the LEDs 3112 rest on the track 3114 above the gap 3120.

Figure 32:
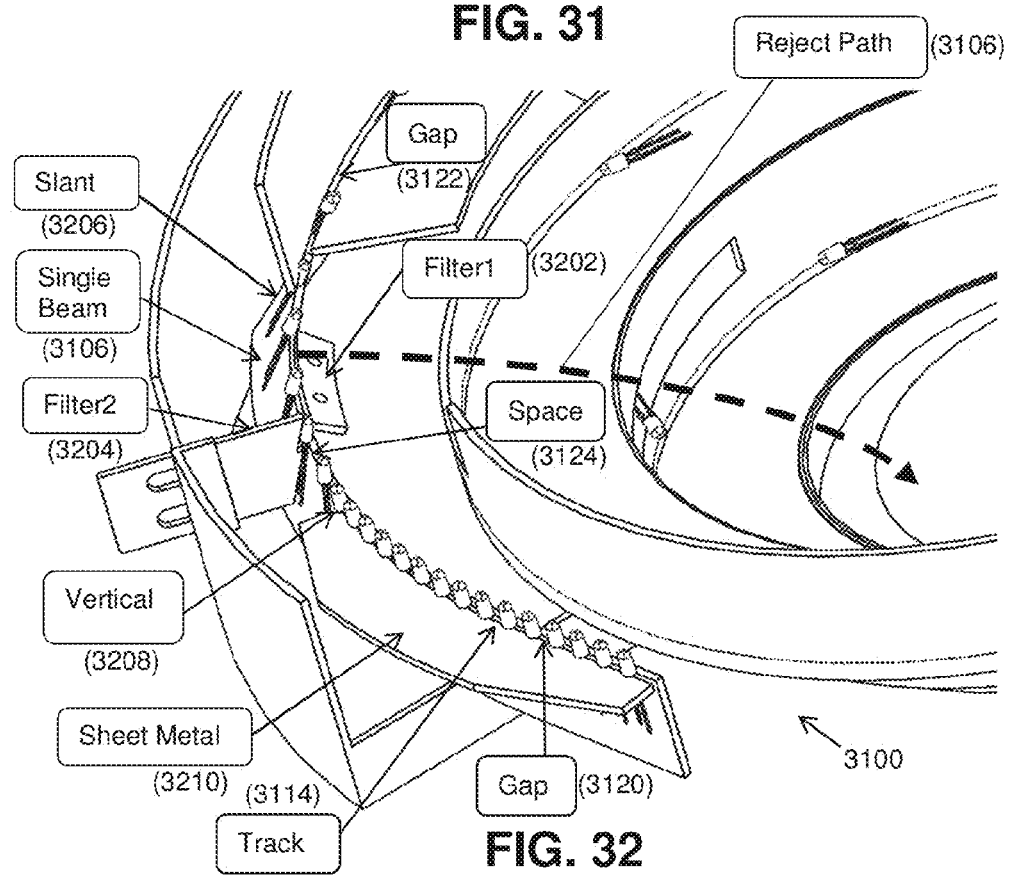
FIG. 32 illustrates filters in the vibratory bowl.

With reference to FIG. 31 and FIG. 32, the two filters 3108, more specifically, filter1 3202 and filter2 3204 are disposed along the single beam 3106 where the LEDs 3112 are seated and moved one after another. The two filters 3202 and 3204 are designed according to the component shape to allow only non-defective shaped components to pass by and components with defective shape are swept off the single beam 3106 and dropped into the bowl via the reject paths 3110 for recycling.

The single beam 3106 is in this case a sheet metal designed with a shape varying from a slant 3206 at one end, where the single beam 3106 can hold the LEDs 3112 by allowing LED leads of each LED to rest on one side with the other side of the LED leads exposed, to a vertical 3208 at another end of the single beam 3106, where the single beam 3106 forms a gap 3120 together with another piece of sheet metal 3210 for holding the LED leads of the LEDs 3112.

The filter1 3202 filters away defective LEDs that are able to have LED leads pass through a gap 3122 located at the top of the bowl 3100 along the spiral path 3104 but are not able to sit on the single beam 3106 with one side of the LED leads exposed after the LEDs 3112 exit the gap 3122.

The filter2 3204 is a projection in the direction of the LEDs 3112 on the single beam 3106. The direction of the projection of the filter2 3106 is substantially orthogonal to a surface of the single beam 3106 where the LED leads are sifted. The projection of the filter2 3204 ends with a shape conforming to the shapes of the LED heads and the LED leads of the LEDs 3112 so as to form a space 3124 allowing only LEDs 3112 with right LED head size and LED lead size to pass through.

The bowl opening 3116 of the bowl 3100, where the bowl 3100 connects to the linear rail or also known as the primary rail 3118 (same as any one of the primary rails 608 in FIG. 6), is configured to be straight for aligning with the linear rails. The bowl opening 3116 transfers the LEDs 3112 to the linear rails with the LEDs sitting on the track 3114 with LED leads facing downwards and LED heads facing upwards.

Sensors

As discussed earlier with reference to FIG. 6, there are 3 sensors 610 (all circled out in FIG. 6) mounted on each of the primary rails 608 A, B and C respectively and there are 3 sensors 612 (all circled out in FIG. 6) mounted on each of the secondary rails 616 A, B and C respectively. Similarly, there are 3 sensors 810 in FIG. 8 mounted on each of the primary rails 808 A, B and C in FIG. 8 respectively and there are 3 sensors 812 in FIG. 8 mounted on each of the secondary rails 816 A, B and C in FIG. 8 respectively.

Figure 29:
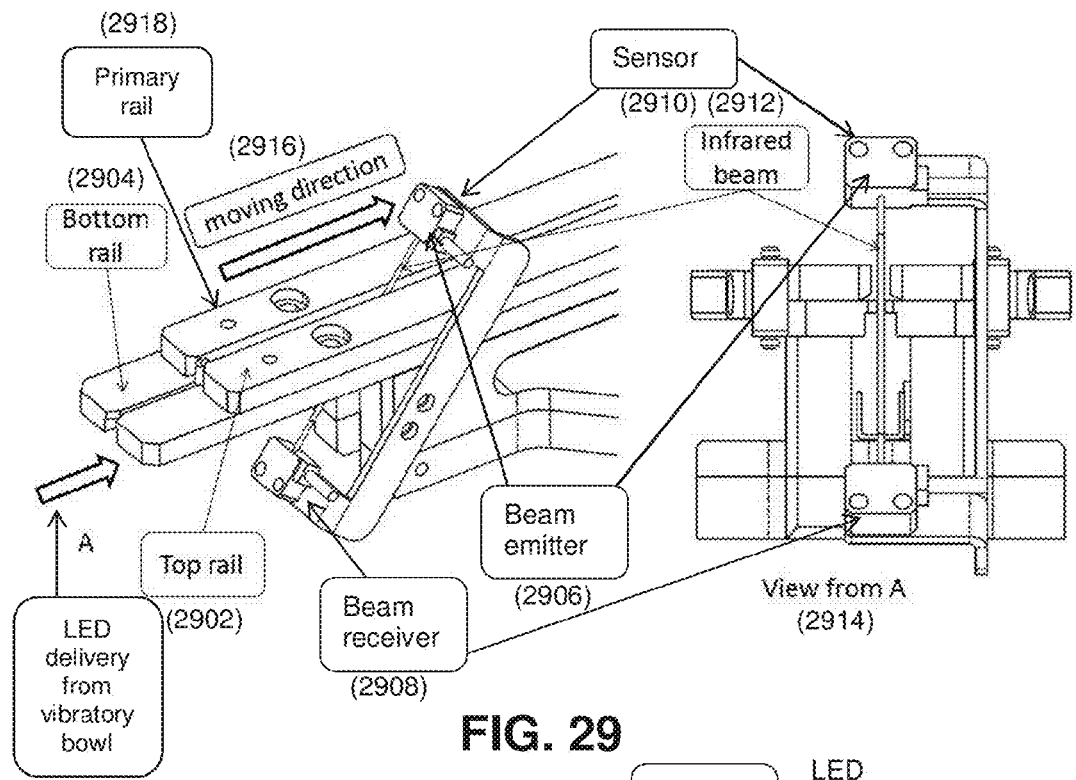
FIG. 29 shows a perspective view and a front view of a sensor on a rail in the first and second example machines.
Figure 30:
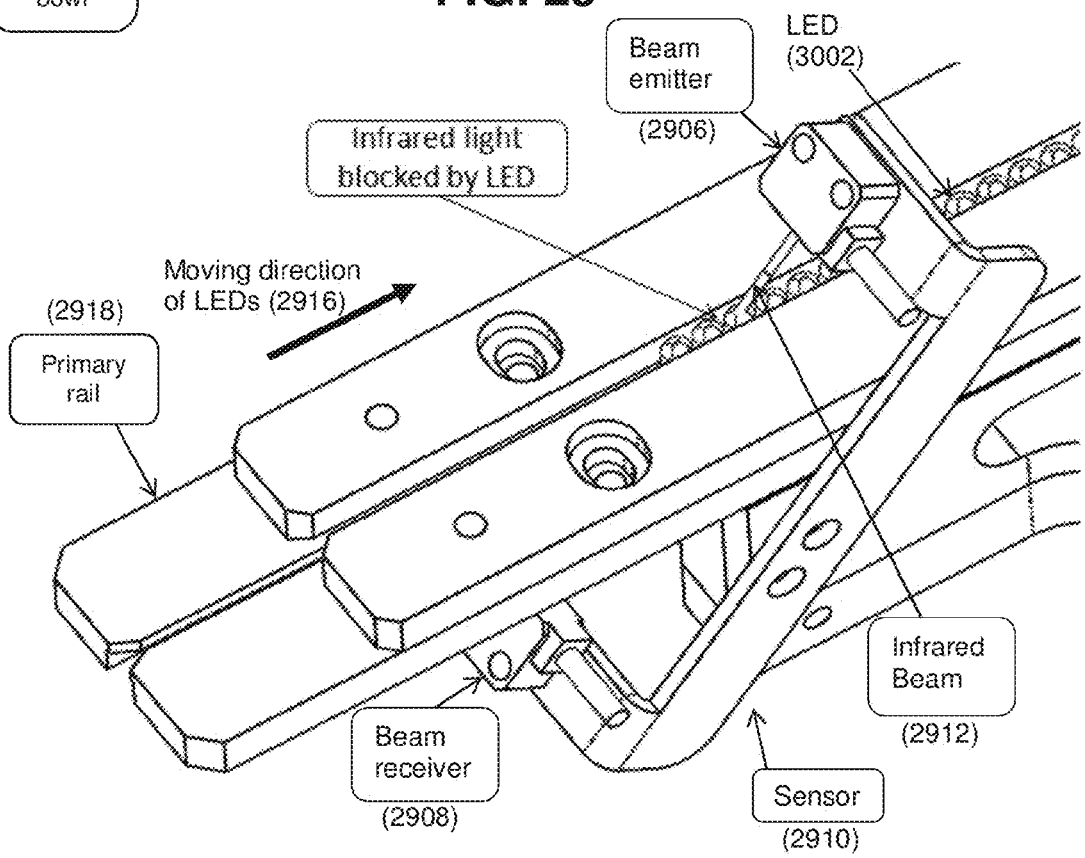
FIG. 30 shows another perspective view of the sensor.

FIGS. 29 and 30 illustrate the operation of each of the sensors 610, 612, 810, and 812 during operation. There is shown a sensor 2910 similar to each of the sensors 610, 612, 810, and 812 installed near a connecting point between a primary rail 2918 (similar to each of the primary rails 608 in FIGS. 6 and 808 in FIG. 8) and a vibratory bowl (not shown in FIGS. 29 and 30 but similar to either one of the bowls 602, 604 and 606 in FIG. 6 and the bowls 802, 804, and 806 in FIG. 8).

The primary rail 2918 has a pair of top rails 2902 with a gap therebetween where the LED heads of the LEDs 3002 reside. The LEDs 3002 are driven by the linear drive (similar to the linear drive 706 in FIG. 7) to move along the primary rail 2918 towards a component processing unit (not shown in FIGS. 29 and 30) similar to the component processing units 614 or 814. The primary rail 2918 has a pair of bottom rails 2904 with a gap therebetween where the LED leads of the LEDs 3002 reside. A secondary rail of the example illustrated by FIGS. 29 and 30 is similar to each of the secondary rails 616 A, B and C in FIG. 6 and the secondary rails 816 A, B and C in FIG. 8 has the same features as that of the primary rail 2918.

The sensor 2910 has a beam emitter 2906 for emitting an infrared beam or light 2912 and a beam receiver 2908 for receiving the infrared beam 2912 emitted. The sensor 2910 is installed such that the infrared beam 2912 disposed between the beam emitter 2906 and the beam receiver 2908 is concentric. The beam emitter 2906 continuously transmits infrared beam 2912 through the gaps between the top rails 2902 and the gaps between the bottom rails 2904 and the beam receiver 2908 continuously receives the infrared beam 2912 emitted.

When LEDs 3002 moving along the primary rail 2918 in the moving direction of the LEDs 2916 pass through the infrared beam 2912, the infrared beam 2912 will be blocked. If the sensor 2910 detects that the infrared beam 2912 is blocked for more than a predetermined time period (for instance, a time period programmed based on feeding speed to the component processing unit), it is indication that no further LEDs 3002 moving from the vibratory bowl should be transferred to the primary rail 2918. Hence, a signal will be sent from the sensor 2910 to pause the vibration of the corresponding vibratory bowl until the LEDs 3002 on the primary 2918 have moved on and are no longer blocking the infrared beam 2912.

In the case that the sensor 2910 is a sensor on a secondary rail (either one of the secondary rails 616 A, B and C in FIG. 6 and the secondary rails 816 A, B and C in FIG. 8) instead of the primary rail 2918, the sensor is installed at a position of the secondary rail near a connecting point between the component processing unit (similar to the component processing units 614 or 814) and the secondary rail. When LEDs 3002 moving along the secondary rail pass through the infrared beam 2912 of the sensor 2910, the infrared beam 2912 will be blocked. If the sensor 2910 detects that the infrared beam 2912 is blocked for more than a predetermined time period (for instance, a time period programmed based on feeding speed to the component feeder 218 in FIG. 2 or the corresponding component feeder of the second example machine), it is indication that no further LEDs 3002 moving from the component processing unit should be transferred to the secondary rail. Hence, a signal will be sent from the sensor 2910 to pause the transfer of more components at the component processing unit until the LEDs 3002 on the secondary rail have moved on and are no longer blocking the infrared beam 2912.

Although not shown in the Figures, the sensor 2910 is connected to a processor and the operations of the sensor 2910 are also controlled and monitored by the processor. In the case that the sensor 2910 is used on the primary rail 2918, the processor is connected to the vibratory bowl drive (For instance, the bowl drive 704 in FIG. 7) responsible for transferring LEDs to the primary rail 2918. In the case that the sensor 2910 is used on the secondary rail, the same or another processor is connected to the component processing unit. Therefore, the "pause" signal sent from the sensor 2910 can be processed by the processor, which would control the vibratory bowl drive or the component processing unit to pause their operations so that no LEDs are further transferred. The processor also resumes the operations of the vibratory bowl drive or the component processing unit to continue to transfer the LEDs when the sensor 2910 sends another signal because LEDs no longer blocks the infrared beam 2912 for longer than the predetermined time period.

Component Processing Units

With reference to FIG. 6, 3 component processing units 614 A, B and C are mounted adjacent to an end of each of the primary rails 608 A, B and C respectively and adjacent to an end of each of the secondary rails 616 A, B and C. Similarly, with reference to FIG. 8, 3 component processing units 814 A, B and C are mounted adjacent to an end of each of the primary rails 808 A, B and C respectively and adjacent to an end of each of the secondary rails 816 A, B and C.

Figure 10:
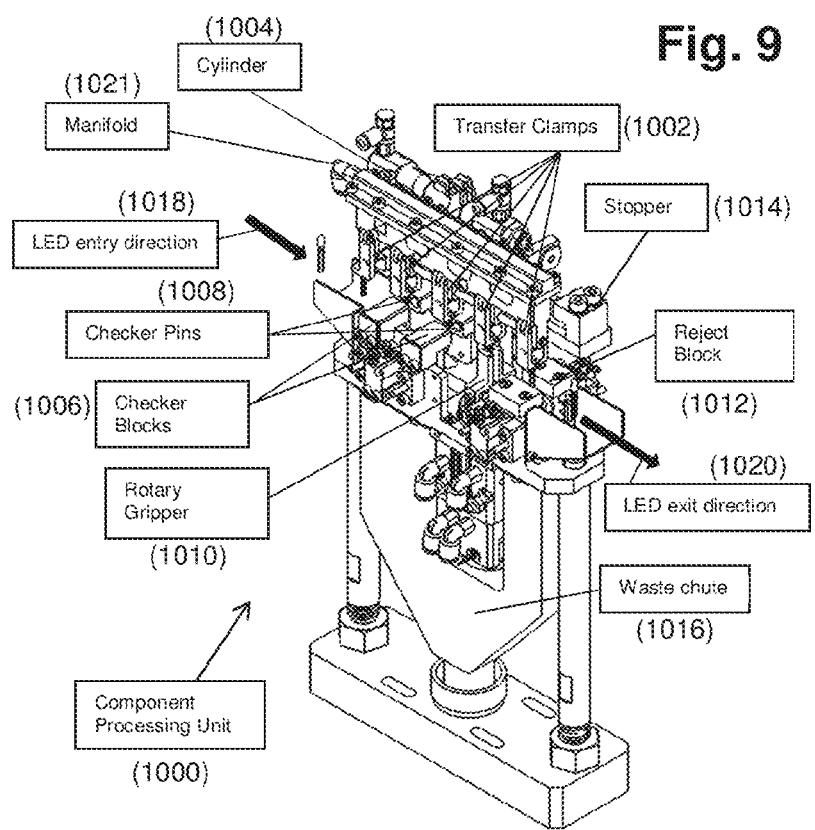
FIG. 10 is a perspective view of a component processing unit for checking operation of components, orientation adjustment and screening out faulty components.

With reference to FIG. 10, there is shown a component processing unit 1000 representative of each of the component processing units 614 in FIGS. 6 and 814 in FIG. 8. The component processing unit 1000 comprises 5 pairs of clamps 1002 or claws driven by a hydraulic and/or pneumatic system having a manifold 1021 required for driving the clamps 1002,
a cylinder 1004 for driving reciprocating movements of the 5 pairs of clamps together with the manifold 1021,
2 checker blocks 1006 (a checker block is also known as a checker) with 2 corresponding checker pins or probes 1008 (referred by a single reference numeral for convenience) inserted into each of the 2 checker blocks 1006,
a rotary gripper 1010 for rotating orientation of LEDs found not to have a predetermined orientation after checking by the 2 checker blocks 1006,
a reject block (also known as reject station) 1012 for rejecting defective components discovered after checking by the 2 checker blocks 1006,
a pair of stoppers 1014 for stopping the cylinder 1004 when the cylinder 1004 moves the clamps 1002 to a next position and returns back, and
a waste chute 1016 connected to the reject block 1012 for receiving rejected defective components.

Direction of entry of LEDs 1018 to the component processing unit 1000 and direction of exit of LEDs 1020 from the component processing unit 1000 are marked out by arrows in FIG. 10.

Figure 11:
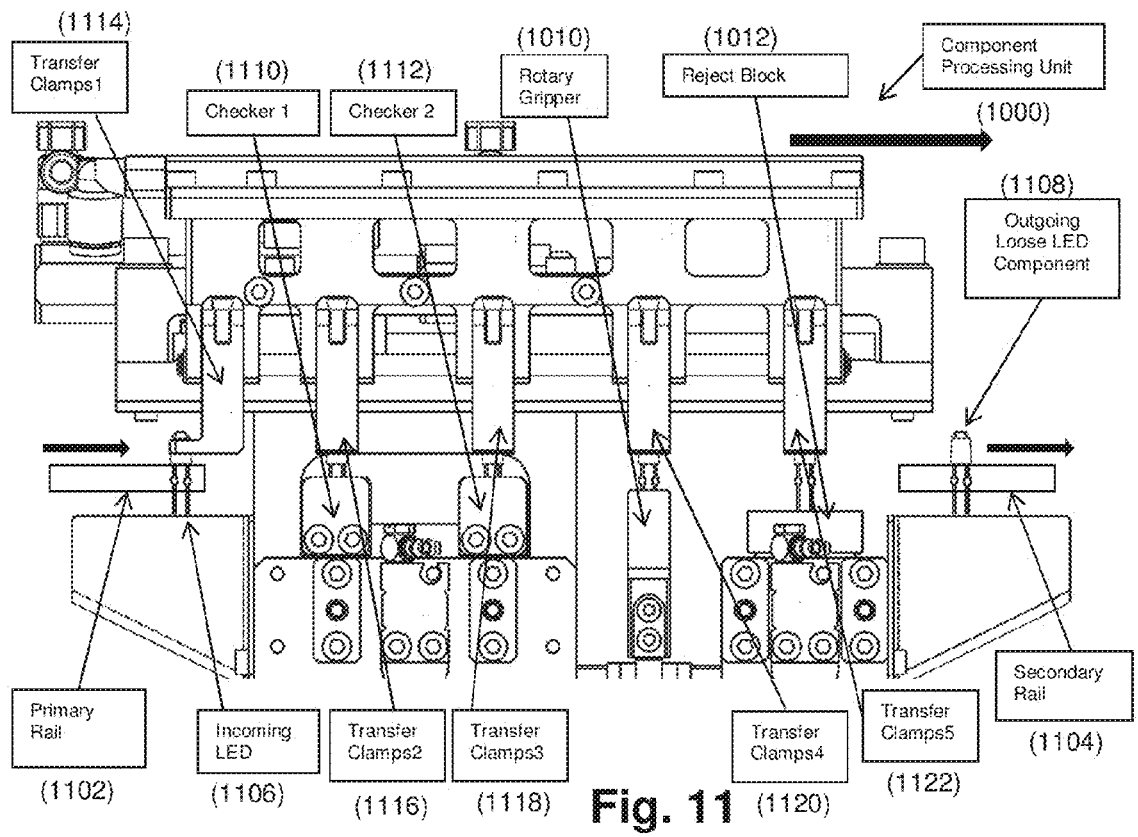
FIG. 11 is a side view of the component processing unit.

FIG. 11 shows a side view of the component processing unit 1000 in FIG. 10. The 2 checker blocks 1006 are more clearly shown as checker1 1110 and checker2 1112 in FIG. 11. The 5 pairs of transfer clamps 1002 in FIG. 10 are more clearly shown in order as transfer clamps1 1114, transfer clamps2 1116, transfer clamps3 1118, transfer clamps4 1120 and transfer clamps5 1122 in FIG. 11. The 5 pairs of transfer clamps 1002 are positioned in line and operate simultaneously to move LED components in the same direction marked out by arrows in FIG. 11.

Furthermore, FIG. 11 shows a primary rail 1102 (similar to each of the primary rails 608 in FIG. 6 and the primary rails 808 in FIG. 8) positioned closest to the transfer clamp1 1114 and a secondary rail 1104 (similar to each of the secondary rails 616 in FIG. 6 and the secondary rails 816 in FIG. 8) positioned closest to the transfer clamp5 1122.

With reference to FIGS. 10 and 11, generally, the component processing unit 1000 is for LED polarity checking and it is activated by in this case, a pneumatic system. The 5 transfer clamps 1002 are for transferring components between different areas for different purposes. The clamping function of the clamps 1002 is driven by air pressure applied to a piston in the manifold 1021.

The component processing unit 1000 uses the transfer clamps1 1114 to receive an incoming LED component 1106 from the primary rail 1102. The secondary rail 1104 receives a loose outgoing LED component 1108 transferred from the component processing unit 1000 by the transfer clamps5 1122. The transfer clamps2 1116 and transfer clamps3 1118 are used for transferring the LED components to the checker 1110 and the checker 1112 respectively. The transfer clamps4 1120 is used for transferring the LED components to the rotary gripper 1010.

The checker1 1110 and the checker2 1112 are for LED polarity checks and for determining whether LEDs transferred to them are functioning electrically. Not functioning LEDs are recorded as a defective component.

The rotary gripper 1010 is for revising lead positioning and orientation, if necessary, by rotating the LED so that the LED assumes a predetermined orientation. The predetermined orientation may be such that the LED lead with positive polarity of the LED is orientated to face the secondary rail 1104 and the LED lead with negative polarity of the LED is orientated to be trailing the LED lead with positive polarity and facing the primary rail 1102. The predetermined orientation may also be that the LED lead with negative polarity of the LED faces the secondary rail 1104 and the LED lead with positive polarity of the LED faces the primary rail 1102.

The reject block 1012 is located beneath the transfer clamps5 1122 for rejecting the defective components discovered by the checker1 1110 and the checker2 1112.

Once a LED component is transferred to the checker1 1110 and the checker2 1112, the checker1 1110 and the checker2 1112 will check the polarities of the two leads of the LED component. Each of the checker1 1110 and the checker2 1112 is equipped with 2 electro-conductive probes or checker pins 1008, which are connected to a checker unit board for polarity analysis. The motion of the rotary gripper depends on the checking outcome of the checker blocks. A result contrary to a predetermined acceptable one will lead the rotary gripper 1010 to rotate the LED by 180 degrees so that the predetermined orientation of the LED is obtained. If the outcome of the polarity check suggests that polarities of both the LED leads of an LED are the same, the LED would be regarded as defective and the reject block 1012 will open to reject the defective component into the waste chute 1016 when the defective LED is transferred to the transfer clamps5 1122.

Although not shown in the Figures, the checker1 1110, the checker2 1112, the driving mechanism for the transfer clamps 1002, and the reject block 1012 are connected to a processor, which controls and monitors the operations of these devices.

More details on polarity checking is as follows. During operation, a LED component is clamped by the transfer clamps1 1114 from the primary rail 1102 and delivered to the checker1 1110. The checker1 1110 is connected to a pair of probes 1008 that will light up the LED if the polarities of the LED leads of the LED placed into the pair of probes 1008 by the transfer clamps2 1116 matches the polarities of the probes. If the LED lights up and the polarities of the LED leads of the checked LED matches with the polarities of the probes 1008, the checker1 1110 sends a signal "1" to a processor. If the polarities of the LED leads of the checked LED do not match with the polarities of the probes 1008, the LED will not light up and the checker1 1110 will send a signal "0" to the processor. After the polarities of the LED leads of the LED are checked by the checker1 1110, the transfer clamps2 1116 transfers the checked LED to the checker2 1112 for further check. The checker2 1112 is also connected to a pair of probes 1008. However, the polarities of the pair of probes 1008 of the checker2 1112 are positioned to be opposite to the polarities of the pair of probes 1008 of checker1 1110.

The rotary gripper 1010 and reject block 1012 act according to the signals from the checker1 1110 and checker2 1112 combinations, as shown in the table below. It is appreciated that the table is just an example and the desirable polarities and signals may be programmed according to a user's PCB specification. In the present component processing unit 1000, the distance between every two of the four stations that is the checker1 1110, checker2 1112, the rotary gripper 1010 and the reject block 1012 is defined based on a stroke of the driving cylinder 1004. In this case, the distance is 30 mm. This distance is variable depending on available space allocated for mounting the component processing unit 1000. The shape of each of the transfer clamps 1002 can be configured to cater for transferring of electronic components (not just LEDs) with different shapes and sizes.

TABLE 1

| Checker1<br>1110 Signal | Checker2<br>1112 Signal | Rotary<br>Gripper 1010 | Reject<br>Block 1012 |
| --- | --- | --- | --- |
| 1 | 0 | Pass | Pass |
| 0 | 1 | Rotate 180 degrees | Pass |
| 0 | 0 | Pass | Drop |
| 1 | 1 | Pass | Drop |

"Pass" means allowing the LED to pass through the station. The respective ones of the transfer clamps 1002 operating at the station will carry out the passing. "Rotate 180 degrees" means rotate the LED by 180 degrees. In table 1, such rotation is done when there is a finding that the polarities of leads of an LED does not match the probes 1008 of the checker1 1110 but matches the polarities of the probes 1008 of the checker2 1112. "Drop" is carried out at the reject block 1012 to reject a defective LED when there is a finding that none of the polarities of leads of the defective LED matches the polarities of the probes 1008 of the checker1 1110 and the polarities of the probes 1008 of the checker2 1112. "Drop" is also carried out when all the polarities of leads of the defective LED matches the polarities of the probes 1008 of the checker1 1110 and the polarities of the probes 1008 of the checker2 1112.

After the polarity check is completed by the component processing unit 1000, the LED components are delivered to the secondary rail 1104 and queued for feeding to the component insertion section 204 in FIG. 2 or the component insertion section 304 in FIG. 3.

Figure 26:
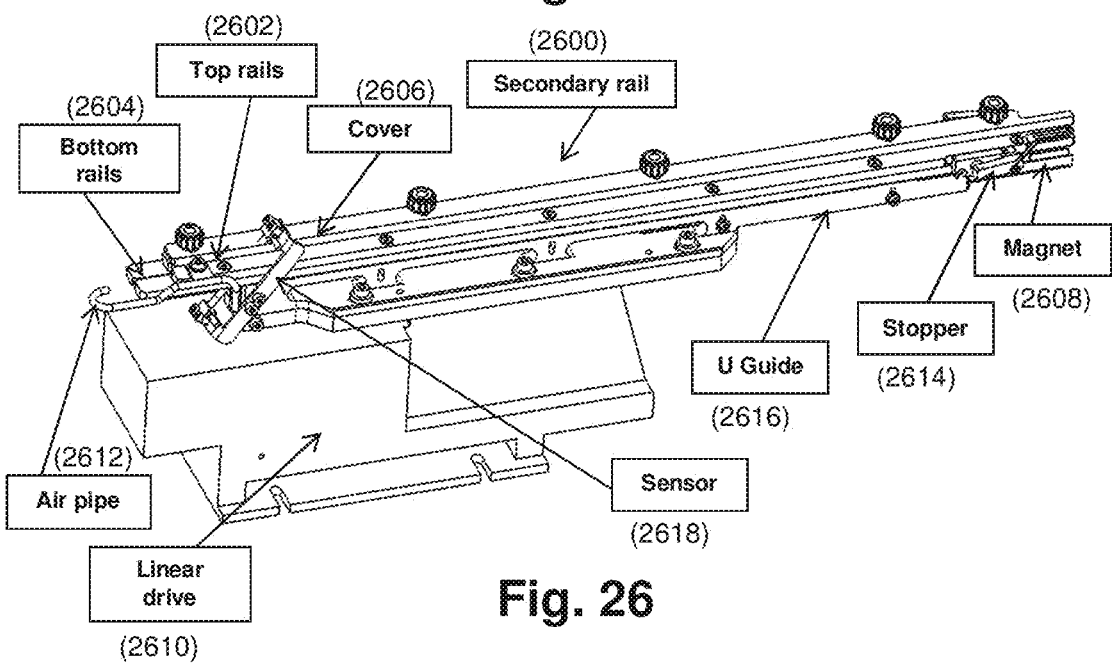
FIG. 26 is a drawing of a secondary rail for the first example machine.
Figure 27:
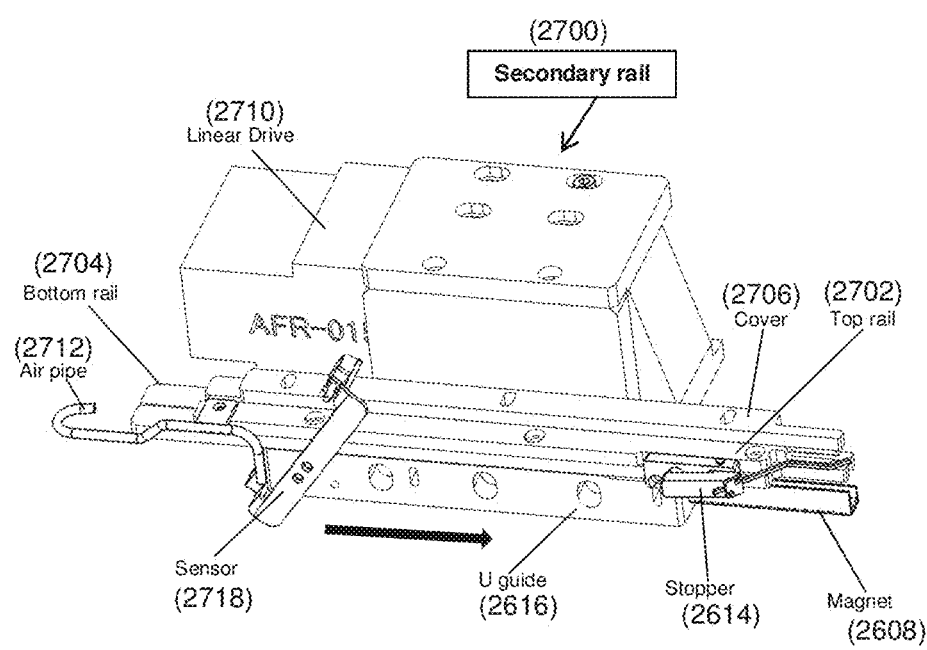
FIG. 27 is a drawing of a secondary rail for the second example machine.

Detailed structural drawings of the secondary rail 1104 are shown as secondary rail 2600 in FIG. 26 and secondary rail 2700 in FIG. 27. The secondary rail 2600 in FIG. 26 is for use in the first example machine 200 in FIG. 2 and the secondary rail 2700 in FIG. 27 is for use in the second example machine 300 in FIG. 3. The secondary rails 2600 and 2700 are each largely similar to each of the primary rails described in the present disclosure. That is, each of these secondary rails 2600 and 2700 incorporates the same respective key components of the previously described primary rails:

- pairs of top rails 2602 and 2702 for receiving processed LEDs from any of the component processing unit (for example 1000) as described earlier and, specifically, for guiding the LED heads of the LEDs,
- pairs of bottom rails 2604 and 2704 for receiving processed LEDs from any of the component processing unit (for example 1000) as described earlier and, specifically, for sitting the LED leads of the LEDs,
- covers 2606 and 2706 acting like a fence for preventing LEDs from falling off from the respective secondary rails 2600 and 2700,
- stopper units 2614 and 2714 for stopping LED components at the end of the pairs of top rails 2602 and 2702 and the pairs of bottom rails 2604 and 2704 to wait for a component processing unit to pick up LED components one by one,
- magnets 2608 and 2708 for exerting magnetic force to maintain LEDs on the respective secondary rails 2600 and 2700 in an orientation such that the LED leads of the LEDs are pointing downwards and the LED heads of the LEDs are pointing upwards,
- linear drives or feeders 2610 and 2710 for driving movement of the LEDs on the secondary rail 1104,
- U guides 2616 and 2716 for supporting the pairs of top rails 2602 and 2702 and the pairs of bottom rails 2604 and 2704 and transmitting vibration from the linear drives 2610 and 2710, and
- sensors 2618 and 2718 similar to the sensor 2910 in FIG. 29 mounted to each of the secondary rails 2600 and 2700 respectively that is used to generate a signal to pause the component processing unit 1000 from transferring more LED components to each of the secondary rails 2600 and 2700 respectively when a location on each of the secondary rails 2600 and 2700 respectively is detected to have presence of LED component for a predetermined period of time.

However, in addition to the previously described primary rails, each of the secondary rails 2600 and 2700 has an air pipe 2612 and 2712 respectively disposed on an edge of the respective secondary rails 2600 and 2700. The edge is located at an end of the respective secondary rails 2600 and 2700 for receiving LED components from the component processing unit 1000. The air outlets of the respective air pipes 2612 and 2712 are facing the secondary rails 2600 and 2700. In this manner, after LED components are transferred to the respective secondary rails 2600 and 2700 from the component processing unit 1000, air is blown from the respective air pipes 2612 and 2712 towards the delivery direction of the LED components so as to accelerate movement of the LED components along the respective secondary rails 2600 and 2700.

Furthermore, different from the linear drive 2610 in FIG. 6, which is located beneath the secondary rail 2600, the linear drive 2710 in FIG. 7 is mounted beside the secondary rails 2700.

Component Feeder

Figure 12:
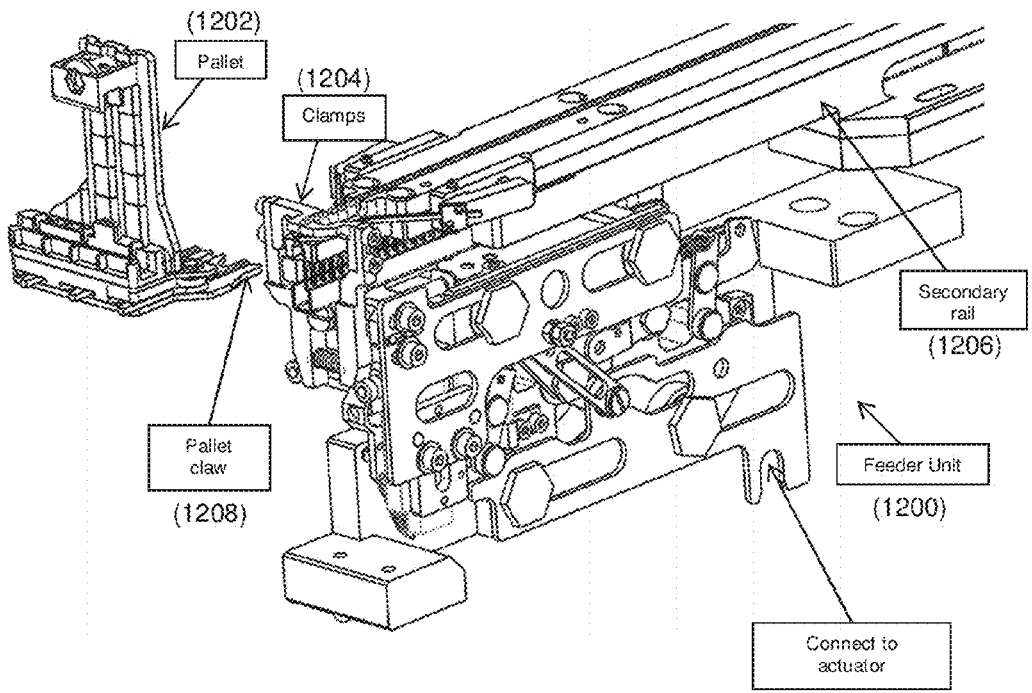
FIG. 12 shows the connection of loose LED feeder with secondary rail and pallet.
Figure 13:
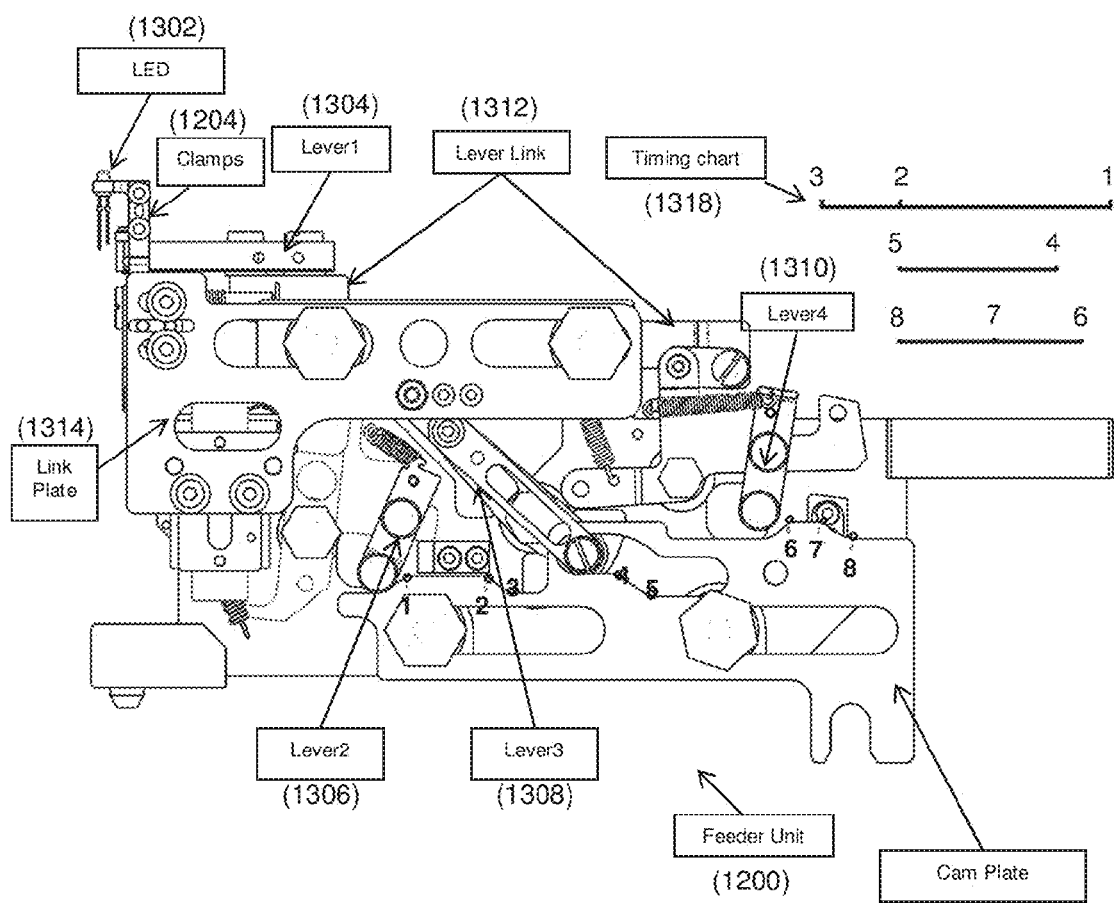
FIG. 13 is a plan view of a component feeder and a rough movement timing chart.

With reference to FIG. 12, for both the first example machine 200 in FIG. 2 and the second example machine 300 in FIG. 3, 3 component feeders like the component feeder 1200 (also known as a loose LED feeder) illustrated in FIGS. 12 and 13 are installed as an interface between the respective component processing and feeding section 202 and 302 and the respective component insertion section 204 and 304 for feeding LED components one by one to a pallet 1202. The pallet 1202 has a plurality of pallet claws or clamps 1208 each configured to hold one LED component. During operation, the pallet 1202 is brought to the vicinity of the transfer clamps 1204 by a sequencing system of the component insertion section (main machine) (For example, 204 in FIG. 2 and 304 in FIG. 3) so that the transfer clamps 1204 can feed LED components into each of the plurality of pallet claws. The bottom of the component feeder 1200 is connected to an actuator 1210 driving the component feeder 1200. The component feeder 1200 includes a pair of transfer clamps 1204 positioned above an end of a secondary rail 1206 (similar to any one of the secondary rails described earlier) for transferring LED components.

FIG. 13 shows a side or plan view of the component feeder 1200 of FIG. 12. With reference to FIG. 12 and FIG. 13, the component feeder 1200 further includes a lever1 1304 linked to a lever4 1310 via a lever link 1312. To place an LED into each of the plurality of pallet claws 1208 brought to the transfer clamps 1204, the lever1 1304, the lever link 1312, and the lever4 1310 are driven by the actuator 1210 to moves simultaneously and in a direction towards the respective pallet claws 1208 such that the lever1 1304 moves to push open the respective pallet claws 1208. Upon opening of the pallet claws 1208, the transfer clamps 1204 carrying an LED component open to release the LED component and move backwards together with the lever1 1304. As the lever1 1304 moves backwards, the pallet claws 1208 is no longer pushed to open by the lever1 1304, the pallet claws 1208 therefore instantaneously close and grip the LED component. All movements of the component feeder 1200 are driven by a cam plate 1316 linked to a pneumatic cylinder of the actuator 1210. It is possible that in other examples, the functionality of opening the pallet claws 1208 can be altered such that the pallet claws 1208 opens by relying on movement force of the LED component itself instead of using the separate lever1 1304 to push open the pallet claws 1208 in the present example. Such improvement will simplify the design of the component feeder 1200 and improves its reliability. The shape of the transfer clamps 1204 can be configured to cater for transferring of electronic components (not just LEDs) with different shapes and sizes.

The pallet 1202 shown in FIG. 12 is for transferring LED components from the feeding area where LEDs are placed into its pallet claws 1208 to an insertion area of the component insertion section 204 in FIG. 2 or 304 in FIG. 3. In this case, each pallet 1202 has 3 sets of pallet claws 1208, each pallet claw holds a LED component with different color from the LED component held by another pallet claw. The 3 different color LEDs are transferred in predefined order onto the pallet, for example, in the sequence of blue, yellow and green, which is deliberately selected so that the blue, yellow and green LEDs can be inserted in sequence onto a particular PCB in the insertion area.

The operation of the component feeder 1200 is now described in more detail as follows.

With reference to FIGS. 12 and 13, the component feeder 1200 is basically a cam-lever mechanism for feeding components from the secondary rail 1206 to the pallet claws

1208. As mentioned earlier, the cam plate 1316 is driven by the actuator 1210. As a result of the cam plate's reciprocating movement, the component feeder 1200 cycles movement of the transfer clamps 1204 and the lever1 1304 forward and backward (This is one feeding cycle) to feed one LED component to one set of the pallet claws 1208. As the lever1 1304 moves forward and backward, it triggers the set of pallet claws 1208 to open and receive the LED and to close and grip the LED respectively. In the present example, it takes 0.17 seconds to complete one feeding cycle.

FIG. 13 shows a rough movement timing chart 1318. The numbers 1 to 8 in the chart corresponds to movement points 1 to 8 (shown in FIG. 13) of the elements of the component feeder 1200. With reference to FIGS. 12 and 13, as mentioned earlier, lever1 1304 is responsible for opening and closing pallet claws 1208. Lever1 1304 is linked to lever4 1310 via a lever link 1312. As lever4 1310 helps to drive lever1 1304, lever4 1310 is responsible for opening and closing pallet claws 1208 as well. Lever2 1306 is responsible for opening and closing of the transfer clamps 1204. Lever3 1308 drives the transfer clamps 1204 to move forward towards the pallet claws 1208 and backward away from the pallet claws 1208. The cam plate 1316 is configured and shaped such that when it is driven by the actuator 1210, the cam plate 1316 moves lever1 1304, lever2 1306, lever3 1308 and lever4 1310 into action, which in turn drives the transfer clamps 1204 to feed LEDs to the pallet claws 1208 and then return the transfer clamps 1204 and these four levers to their initial position.

Specifically, during operation, the actuator 1210 drives the cam plate 1316 to move and raise lever2 1306 from point 3 to point 2. This will cause the transfer clamps 1204 to close and grip an LED component from the secondary rail 1206. As the cam plate 1316 keeps moving forward, the lever2 1306 keeps approaching point 1 and the transfer clamps 1204 remain closed. Simultaneously, the moving cam plate 1316 causes the lever4 1310 to be lifted up from point 8 to point 7 to push lever1 1304 via the lever link 1312. The moving cam plate 1316 then lifts up lever3 1308 from point 5 to point 4, which pushes the transfer clamps 1204 to move towards the direction to feed the pallet claws 1208. The pallet claws 1208 are fully opened by lever1 1304 once lever4 1310 arrives at point 7. The transfer clamps 1204 reach the feeding destination at the pallet claws 1208 once the lever3 1308 arrives at point 4. There is a time gap between lever4 1310 arriving at point 7 and lever3 1308 arriving at point 4. Upon lever4 1310 passing point 6, lever1 1304 starts to return back or move backwards to its original location and this leads the pallet claws 1208 to close. The transfer clamps 1204 then open and start to move backwards as soon as lever2 1306 passes point 1. At this point, the LED component will be gripped only by the pallet claws 1208 and the feeding motion is completed. Thereafter, the actuator 1210 pulls back the cam plate 1316 to return the transfer clamps 1204 and lever3 1308 to their original position. At the same time, lever2 1306 and lever4 1310 are also pulled back to their initial position.

Features of the component insertion section 204 in FIG. 2 or 304 in FIG. 3 carrying out insertion of the LED components onto PCBs would be described as follows. Namely, the following features would be covered:

- a sequencing system for capturing a LED component and delivering it to a component positioning system and an insertion area in a predetermined sequence,
- the component positioning system is for detecting components on the pallet, adjusting LED components to suitable height, lead distance and position, and cutting excessive lead,
- a component insertion, cut & clinch system for transferring, inserting components into PCB, and cutting and clinching the LED leads of LEDs,
- a PCB transferring system for loading and unloading PCBs, and locating PCBs to the insertion area, and
- a "X-Y" component transfer system for carrying and moving PCB during the insertion process.

The component positioning system, the component insertion, cut & clinch system, the PCB transferring system and the "X-Y" component transfer system are present in the conventional High-speed Radial Lead Component Insertion Machine, RL 132. Hence, the description on these features would be brief.

Sequencing System

Figure 14:
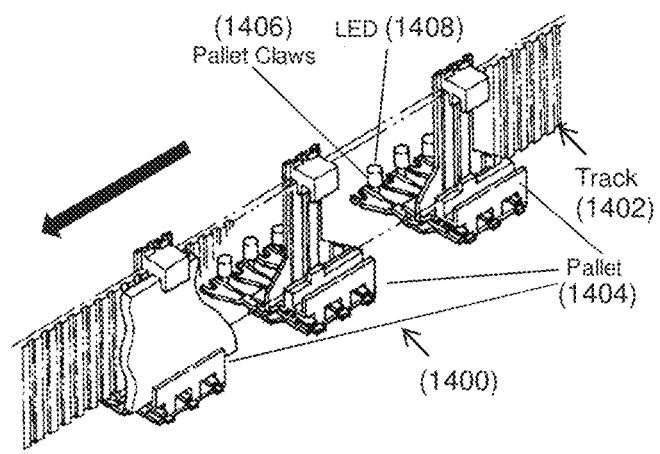
FIG. 14 is a drawing of a sequencing system including a pallet with pallet claws.

FIG. 14 shows an example of the sequencing system. The shown sequencing system 1400 has a belt or track 1402 for moving a plurality of pallets 1404 carrying LEDs 1408 in their respective pallet claws 1406. The belt 1402 is driven by a step motor connected to a processor (not shown), which controls and monitors the step motor. An arrow shows a transferring direction of the LED components on the pallets 1404. The sequencing system 1400 is responsible for bringing each of the pallets 1404 to the vicinity of each of the above-described component feeders (for example, 1200 in FIGS. 12 and 13) of the component processing and feeding section 202 in FIG. 2 or the component processing and feeding section 302 in FIG. 3.

In the present example, the sequencing system 1400 utilises the pallets 1404 and its 3 pallet claws 1406 for transferring 3 LED components respectively to an insertion area in a predefined sequence. For example, 3 types of LED components, red, green and blue are fed and the predefined sequence for insertion is set to be red, green and blue in order. In this case, the 3 component feeders A, B and C (mounted in this alphabetical order) at the component processing and feeding section 202 in FIG. 2 or the component processing and feeding section 302 in FIG. 3 would be configured to handle the predefined sequence of the 3 different colors of LED components. The sequence of LED handling by the 3 feeders units is thus set such that component feeder A handles red, component feeder B handles green, and component feeder C handles blue. As such, each of the 3 pallet claws 1406 takes in red, green and blue in such order. Once a pallet 1404 receives LEDs of all 3 colors in order, the pallet 1404 will transfer the LEDs towards an insertion area for inserting the LEDs onto a PCB in the predefined sequence and color order of the LEDs.

Component Positioning System

Figure 15:
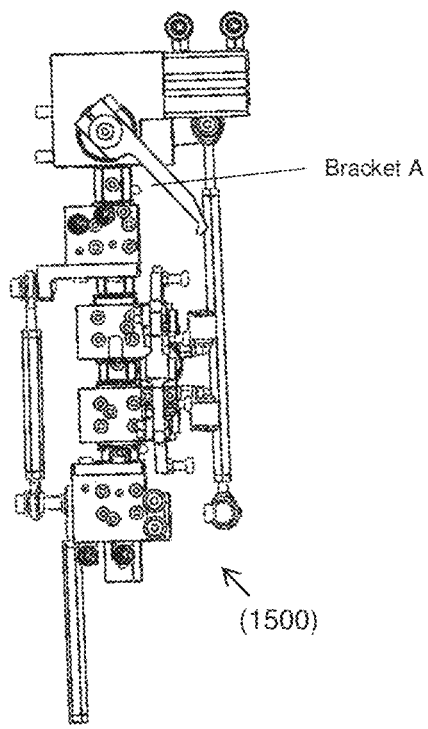
FIG. 15 is a drawing of body positioning unit common to both the first and second example.

When in operation, LED components on a pallet (for example, 1404) will pass through the component positioning system for a series of processing before insertion onto PCBs. Such processing includes LED component body positioning and LED lead correction. The component positioning system is meant for adjusting LED height, x and y positions (x and y are herein defined as two axis that are orthogonal to each other) of the LEDs, lead shape and leads distance, and for cutting lead lengths to a V-shape. The component positioning system has 3 major units: a positioning unit, a body correction unit and a V-cutter. The positioning unit for height adjustment is located at a first position of the component positioning system. The positioning unit ensures the LED components being transferred are of same height and position. FIG. 15 is a drawing of the positioning unit 1500.

Figure 5:
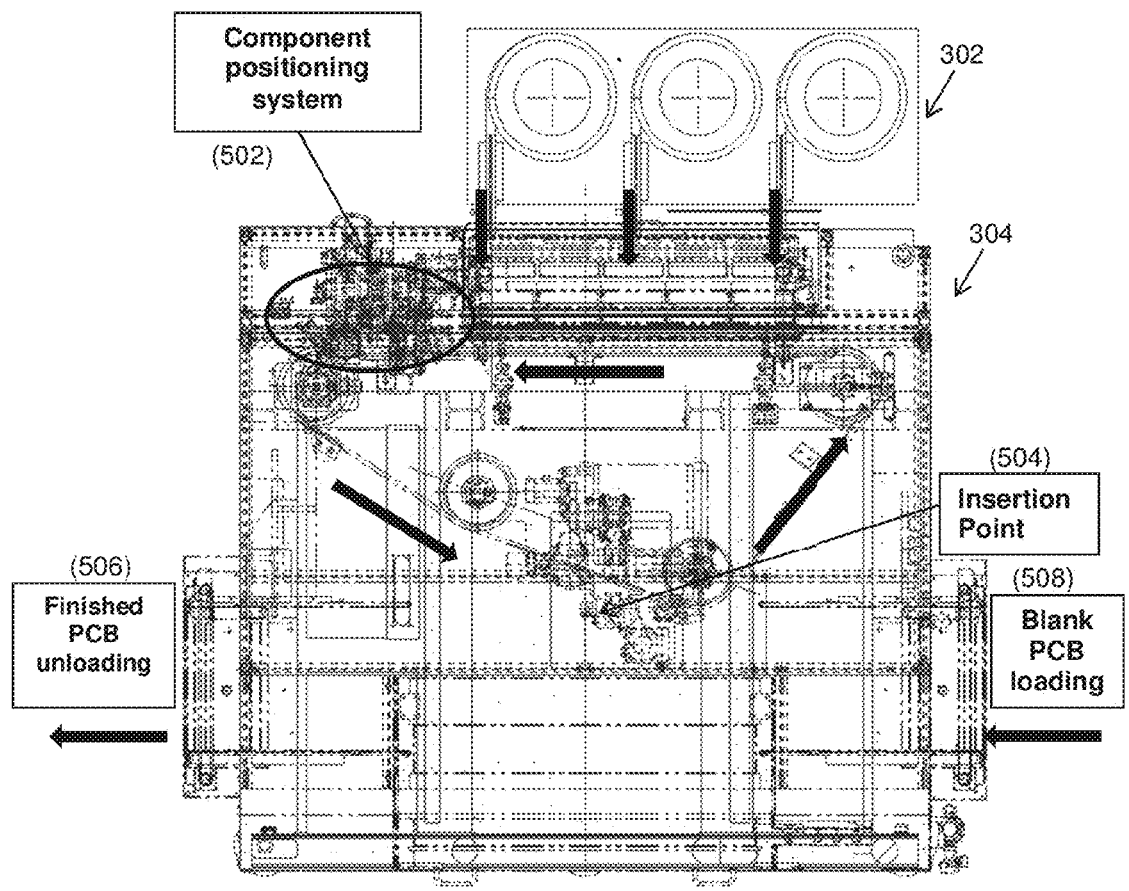
FIG. 5 is a plan view of the second example machine indicating component transferring direction in the machine.
Figure 16:
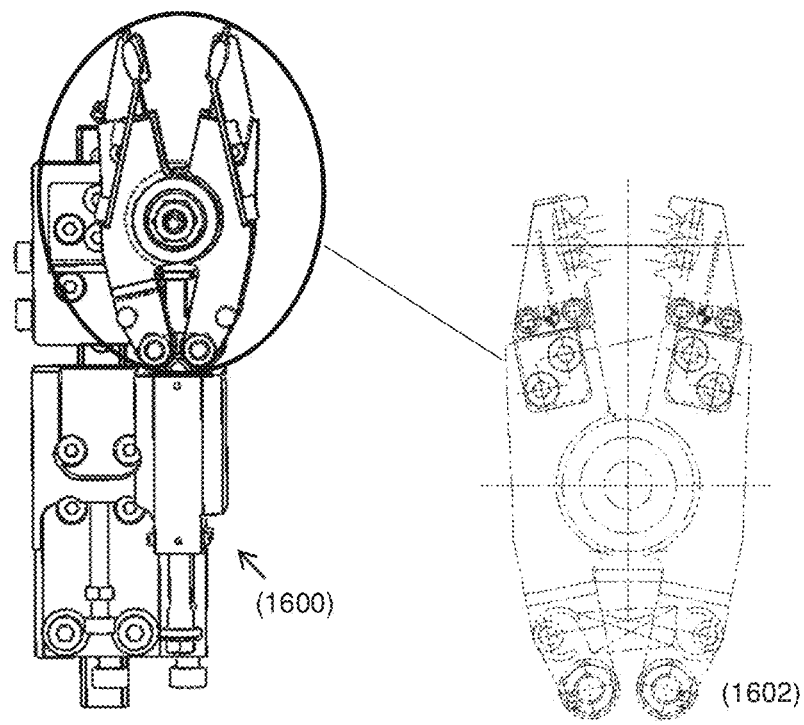
FIG. 16 is a drawing of a lead correction unit and a clamp utilised therein that are common to both the first and second example.
Figure 17:
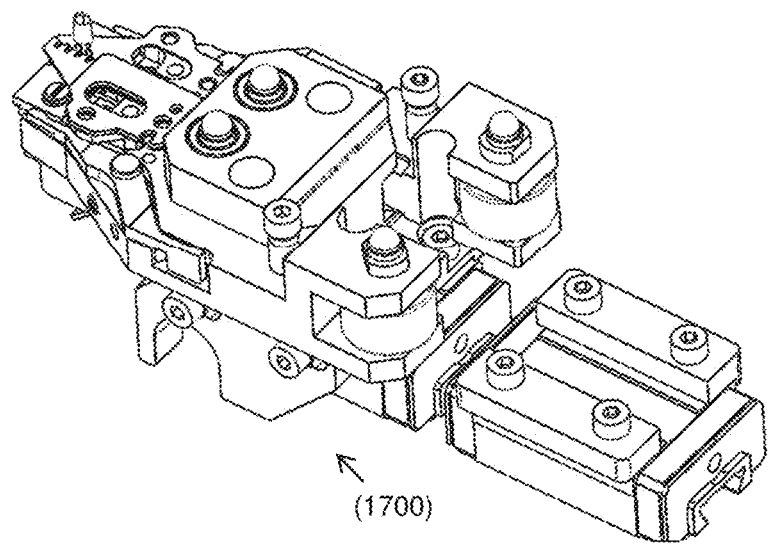
FIG. 17 is a drawing of a V-cutter common to both the first and second example.

Thereafter, the body correction unit is used for straightening the LED leads and adjusting LED leads spacing distance to be at a standard value, for example, 2.5 mm. FIG. 16 is a drawing of the body correction unit 1600 and a clamp 1602 utilised therein. Then, the LED components are transferred to the V-cutter for cutting off excessive lengths of the LED leads. FIG. 17 is a drawing of the V-cutter 1700. FIG. 5 shows a see-through view of the second example machine 300 in FIG. 3. FIG. 5 also shows the location of the component positioning system 502.

Component Insertion, Cut & Clinch System

The component insertion, cut and clinch system comprises a transfer chuck, an insertion chuck, an anvil unit, a PCB loader and unloader, and an X-Y table. The transfer chuck includes a pair of motor-driven clamps to grip components one by one for delivery to the insertion chuck. An insertion head orientates the LED component to a desired orientation as programmed and inserts the LED component into a hole in a PCB. An anvil unit below the PCB cuts excessive lead and clinches the lead of the inserted LED to fix the LEDs on the PCB. The positions of the transfer chuck, the insertion head and the anvil unit are fixed. Hence, the positioning of the insertion point is realized by an X-Y table that is moveable. The X-Y table is able to move along an x and y axis for transferring the PCBs to the insertion position according to the control program. FIG. 5 shows the location of the insertion point 504 in the second example machine 300 in FIG. 3.

Figure 18:
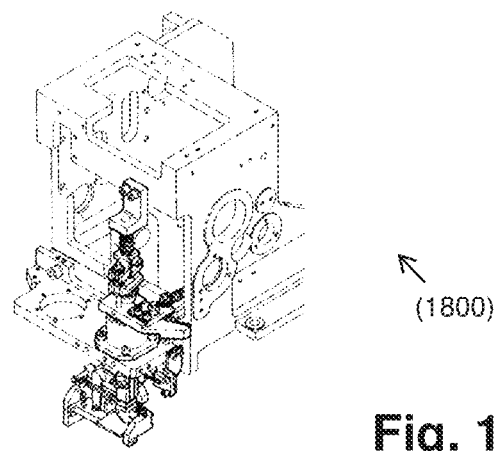
FIG. 18 is a drawing of a transfer chuck common to both the first and second example.

FIG. 18 is a drawing of a transfer chuck 1800. The transfer chuck 1800 is located in the main frame of the machine that is the component insertion section 204 in FIG. 2 or 304 in FIG. 3, next to the insertion head. It takes an LED component from a pallet claw and transfers the LED component.

Figure 19:
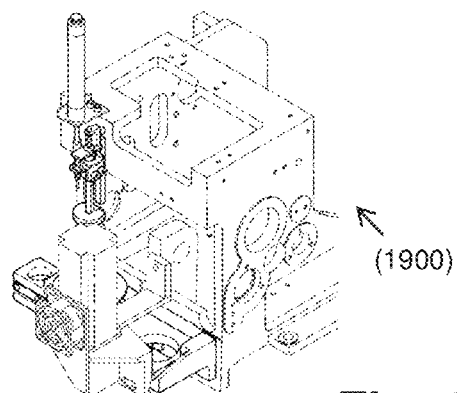
FIG. 19 is a drawing of an insertion head common to both the first and second example.
Figure 20:
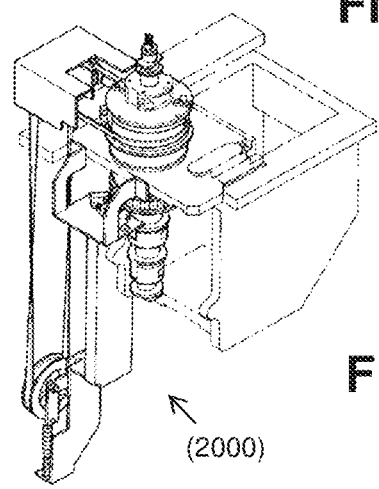
FIG. 20 is a drawing of an anvil unit common to both the first and second example machines.

FIG. 19 is a drawing of an insertion head or chuck 1900. The insertion head is mounted in the main frame that is the component insertion section 204 in FIG. 2 or 304 in FIG. 3. The insertion head receives LED components delivered from the transfer chuck 1800 in FIG. 18 and inserts them into a predetermined position on the PCB. The anvil unit 2000 illustrated by FIG. 20 is located right beneath the insertion head for cutting and clinching the leads of the LED components below the PCB.

PCB Transferring System and "X-Y" Component Transfer System

Figure 9:
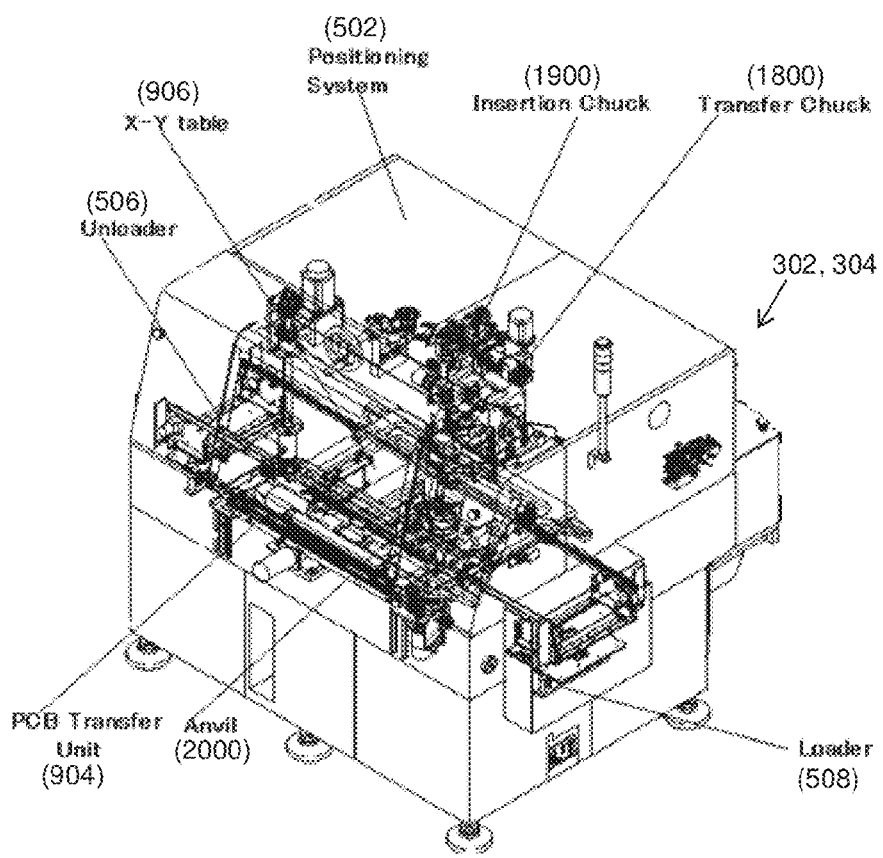
FIG. 9 is a drawing of a component insertion section.

FIG. 9 shows the location of various elements of the component insertion section 204 in FIG. 2 or 304 in FIG. 3. In particular, the locations of the transfer chuck 1800 in FIG. 18, the insertion head or chuck 1900 in FIG. 19, the anvil unit 2000 in FIG. 20, a loader 508 in FIG. 5, an unloader 506 in FIG. 5, a PCB transfer unit 904, an X-Y table 906 and the component positioning system 502 in FIG. 5.

Figure 21:
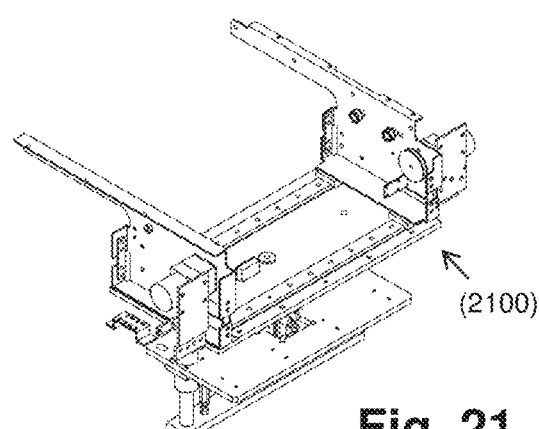
FIG. 21 is a drawing of a loader unit common to both the first and second example machines.
Figure 22:
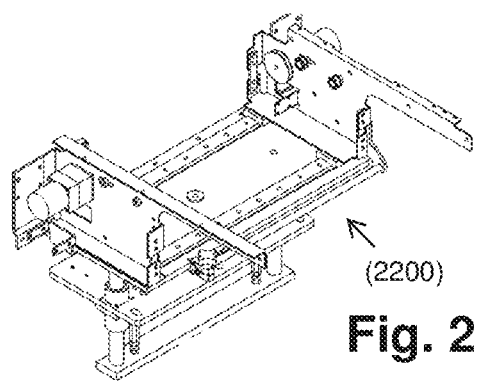
FIG. 22 is a drawing of an unloader unit common to both the first and second example machines.
Figure 23:
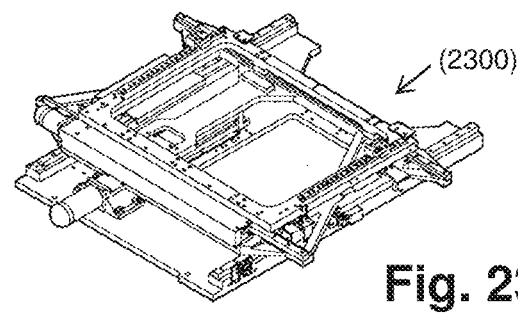
FIG. 23 is a drawing of an X-Y table common to both the first and second example machines.
Figure 24:
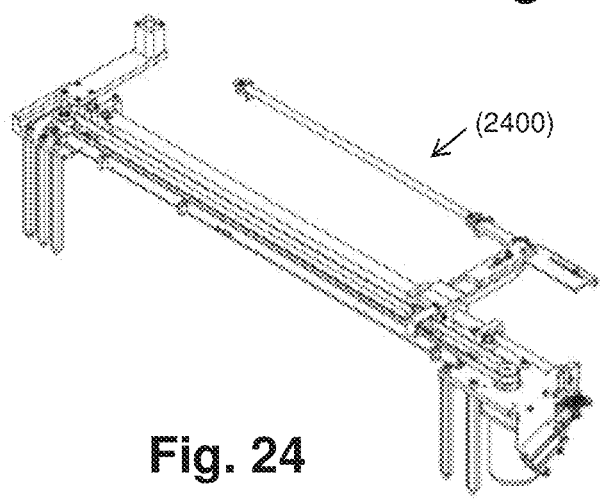
FIG. 24 is a drawing of a Printed Circuit Board (PCB) transfer unit common to both the first and second example machines.

With reference to FIG. 5 and FIG. 9, PCBs are transferred by the PCB transferring system, which comprises the loader 508, the unloader 506, the PCB transfer unit 904 and the X-Y table 906 on the main machine frame that is the component insertion section 204 in FIG. 2 or 304 in FIG. 3. Arrows present in FIG. 5 indicate the transferring direction of the LED components. The loader or loader unit 508 transfers a PCB to the X-Y table 906 before one or more LED components are inserted onto the PCB. The PCB transfer unit 904 thereafter sets the PCB transferred from the loader unit 508 to the X-Y table 906. The X-Y table 906 then moves the PCB to an insertion point or position 504. After the insertion process is complete, the PCB transfer unit 904 unloads the inserted or completed PCB to the unloader unit 506. The unloader unit 506 then unloads the completed PCBs. FIG. 21 is a drawing of a loader unit 2100 the same as the loader 508 in FIG. 5. FIG. 22 is a drawing of an unloader unit 2200 the same as the unloader 506 in FIG. 5. FIG. 23 is a drawing of an X-Y table 2300 the same as the X-Y table 906 in FIG. 9. FIG. 24 is a drawing of a PCB transfer unit 2400 the same as the PCB transfer unit 904.

In accordance with the aforementioned description and the figures, examples of the present disclosure may provide an apparatus for feeding electronic components for insertion onto circuit boards, the apparatus comprising: a vibratory bowl configured for receiving electronic components and for lining up the electronic components onto a moveable conveyor, the vibratory bowl is configured for vibrating and guiding each of the electronic components towards an opening in the vibratory bowl where each of the electronic components is transferred to the conveyor; a component processing unit configured for checking operation of each of the electronic components lined up along the conveyor and for removing any defective electronic component failing the operation check; and a component feeder configured for transferring each of the electronic components that are non-defective to a machine for handling insertion of the electronic components onto circuit boards.

The vibratory bowl may comprise one or more filters configured to allow the electronic components with non-defective shape to move through the one or more filters and to disallow the electronic components with defective shape to move through the filter.

The one or more filters may comprise a gap configured to allow the electronic components with non-defective shape to move through the gap and disallow the electronic components with defective shape to move through the gap.

The one or more filters may comprise a projection ending with a shape conforming to contours of each of the electronic components, the projection being projected towards a track on which each of the electronic components has to pass, wherein the electronic components with non-defective shape are able to move through a gap between the projection and the track but the electronic components with defective shape are unable to move through the gap between the projection and the track. The electronic components that are defective are swept into the vibratory bowl and into a collection point in the vibratory bowl for recycling.

The component processing unit may be configured for determining orientation of each of the electronic components and for orientating one of the electronic components into a predetermined orientation when the determined orientation of said one of the electronic components is not in the predetermined orientation.

The component processing unit may comprise: a first checker having a positive polarity probe and a negative polarity probe, the first checker being configured such that the positive polarity probe engages a first extending lead of each of the electronic components and the negative polarity probe engages a second extending lead of the same electronic component to check whether polarities of the first extending lead and the second extending lead matches polarities of the positive polarity probe and the negative polarity probe respectively; and a second checker having a positive polarity probe and a negative polarity probe, the second checker being configured such that the positive polarity probe of the second checker engages the second extending lead of the same electronic component and the negative polarity probe of the second checker engages the first extending lead of the same electronic component to check whether polarities of the first extending lead and the second extending lead matches polarities of the negative polarity probe of the second checker and the positive polarity probe of the second checker respectively.

One of the first checker or the second checker may be predetermined to be an orientation checker for a predetermined orientation of the electronic components, and in the case of detection of failed polarities matching of one of the electronic components by the orientation checker, the component processing unit is activated to orientate said one of the electronic components into the predetermined orientation.

The apparatus may comprise a second moveable conveyor for transferring each of the electronic components at a location of the component processing unit to a location of the component feeder.

The second moveable conveyor may be incorporated as part of the machine for handling insertion of the electronic components onto circuit boards.

The apparatus may comprise one or more sensors for triggering a signal to pause vibration of the vibratory bowl when a location on the conveyor is detected to have presence of components for a period of time.

The apparatus may comprise one or more sensors for triggering a signal to pause transferring of the components from the component processing unit to the second conveyor when a location on the second conveyor is detected to have presence of components for a period of time.

The one or more sensors for triggering a signal to pause vibration of the vibratory bowl may comprise a beam emitter and a beam receiver, and the signal is triggered when a beam projected from the beam emitter to the beam receiver is blocked by one of the electronic components at the location along the conveyor for the period of time.

The one or more sensors for triggering a signal to pause transferring of the components from the component processing unit may comprise a beam emitter and a beam receiver, and the signal is triggered when a beam projected from the beam emitter to the beam receiver is blocked by one of the electronic components at the location along the second conveyor for the period of time.

The component feeder may be configured for picking up each of the non-defective electronic components and moving one by one each of the electronic components into one or more holding lots in a pallet residing in the machine for handling insertion of the electronic components onto circuit boards.

The pallet may comprise one or more holding lots for holding different types of the electronic components and the component feeder is configured for transferring, a different type at a time, each of the electronic components to each of the holding lots in the pallet.

The apparatus may comprise more than one of the vibratory bowl.

The more than one of the vibratory bowl may be arranged in a row and located adjacent to one another.

Each of the vibratory bowls may handle a different type of the electronic components from the type of the electronic components of another one of the vibratory bowls.

Each of the electronic components may be a Light Emitting Diode.

The apparatus may comprise a taped component feeder for feeding components packaged on a tape.

In accordance with the aforementioned description and the figures, examples of the present disclosure may provide a method for feeding electronic components for insertion onto circuit boards, the method comprising: receiving electronic components into a vibratory bowl; vibrating the vibratory bowl to guide each of the electronic components towards an opening in the vibratory bowl; lining up the electronic components from the opening onto a moveable conveyor; checking operation of each of the electronic components lined up along the conveyor; removing any defective electronic component failing the operation check; and transferring each of the electronic components that are non-defective to a machine for handling insertion of the electronic components onto circuit boards.

The method may comprise filtering the electronic components in the vibratory bowl to allow the electronic components with non-defective shape to move to the opening and to disallow the electronic components with defective shape to move to the opening.

The method may comprise subjecting the electronic components to pass through a gap configured to allow the electronic components with non-defective shape to move through the gap and disallow the electronic components with defective shape to move through the gap.

The method may comprise subjecting the electronic components to pass through a gap formed between a projection projected towards a track and the track on which each of the electronic components has to pass, the projection ending with a shape conforming to contours of each of the electronic components, wherein the electronic components with non-defective shape are able to move through the gap but the electronic components with defective shape are unable to move through the gap.

The method may comprise determining orientation of each of the electronic components; and orientating one of the electronic components into a predetermined orientation when the determined orientation of said one of the electronic components is not in the predetermined orientation.

The method may comprise checking using a first checker having a positive polarity probe and a negative polarity probe, the first checker being configured such that the positive polarity probe engages a first extending lead of each of the electronic components and the negative polarity probe engages a second extending lead of the same electronic component to check whether polarities of the first extending lead and the second extending lead matches polarities of the positive polarity probe and the negative polarity probe respectively; and checking using a second checker having a positive polarity probe and a negative polarity probe, the second checker being configured such that the positive polarity probe of the second checker engages the second extending lead of the same electronic component and the negative polarity probe of the second checker engages the first extending lead of the same electronic component to check whether polarities of the first extending lead and the second extending lead matches polarities of the negative polarity probe of the second checker and the positive polarity probe of the second checker respectively.

The method may comprise predetermining one of the first checker or the second checker to be an orientation checker for a predetermined orientation of the electronic components; and orientating said one of the electronic components into the predetermined orientation in the case of detection of failed polarities matching of one of the electronic components by the orientation checker.

The method may comprise transferring using a second moveable conveyor each of the electronic components at a location of the component processing unit to a location of the component feeder.

The method may comprise incorporating the second moveable conveyor as part of the machine for handling insertion of the electronic components onto circuit boards.

The method may comprise triggering a signal to pause vibration of the vibratory bowl when a location on the conveyor is detected to have presence of components for a period of time.

The method comprise triggering a signal to pause transferring of the components from the component processing unit to the second conveyor when a location on the second conveyor is detected to have presence of components for a period of time.

The method may comprise triggering the signal to pause vibration of the vibratory bowl when a beam projected from the beam emitter to the beam receiver is blocked by one of the electronic components at the location along the conveyor for the period of time.

The method may comprise triggering the signal to pause transferring of the components from the component processing unit when a beam projected from the beam emitter to the beam receiver is blocked by one of the electronic components at the location along the second conveyor for the period of time.

The method may comprise picking up each of the non-defective electronic components; and moving one by one each of the non-defective electronic components into one or more holding lots in a pallet residing in the machine for handling insertion of the non-defective electronic components onto circuit boards.

The pallet may comprise one or more holding lots for holding different types of the electronic components and the method may comprise transferring, a different type at a time, each of the electronic components to each of the holding lots in the pallet.

The method may comprise using more than one of the vibratory bowl.

The method may comprise arranging the more than one of the vibratory bowl in a row and locating the more than one of the vibratory bowl adjacent to one another.

The method may comprise handling a different type of the electronic components for each of the vibratory bowls from the type of the electronic components of another one of the vibratory bowls.

Each of the electronic components processed by the method may be a Light Emitting Diode.

The method may comprise feeding components packaged on a tape to the machine for handling insertion of the electronic components onto circuit boards using a taped component feeder.

Figure 28:
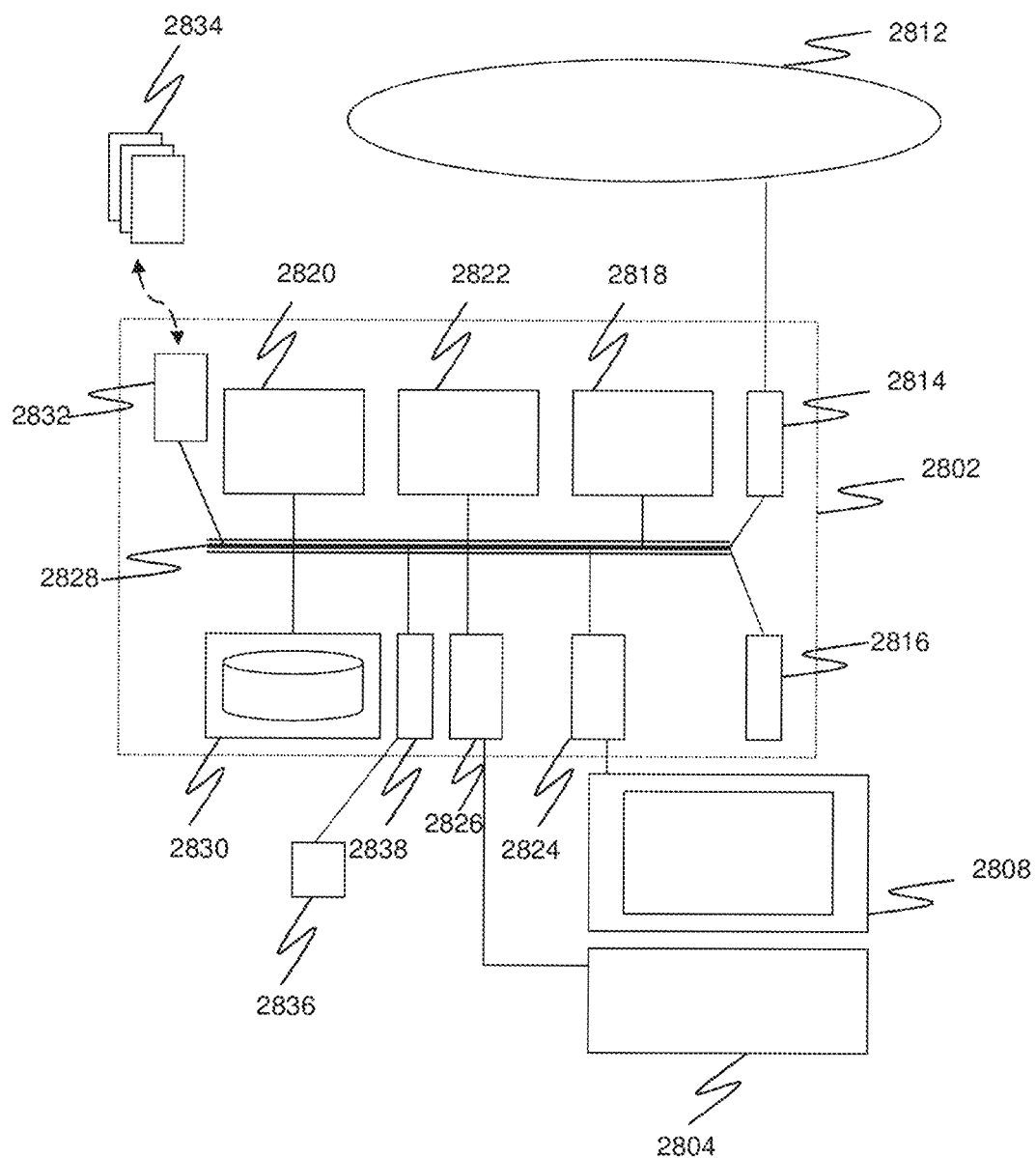
FIG. 28 is a system architecture of a processor common to the first and second example machines.

FIG. 28 shows in more detail an example of the processor that is indicated as connected to the sensors, the checker blocks and reject block in the component processing unit, and the driving mechanisms of the vibratory bowl, the primary and secondary rails, the component processing unit, and/or the component feeder described with reference to the other Figures in the present disclosure. The processor may comprise a processing unit 2802 for processing software including one or more computer programs for running one or more computer/server applications to enable a backend logic flow or the methods for checking polarities of electronic components, checking orientation of electronic components, removing of defective electronic components, checking whether to accept more electronic components onto a conveyor, feeding electronic components for insertion onto circuit boards, which are carried out by the first example machine 200 in FIG. 200 and the second example machine 300 in FIG. 3.

Furthermore, the processing unit 2802 may include user input modules such as a computer mouse 2836, keyboard/keypad 2804, and/or a plurality of output devices such as a display device 2808. The display of the display device 2808 may be a touch screen capable of receiving user input as well.

The processing unit 2802 may be connected to a computer network 2812 via a suitable transceiver device 2814 (i.e. a network interface), to enable access to e.g. the Internet or other network systems such as a wired Local Area Network (LAN) or Wide Area Network (WAN). The processing unit 2802 may also be connected to one or more external wireless communication enabled devices 2834 via a suitable wireless transceiver device 2832 e.g. a WiFi transceiver, Bluetooth module, Mobile telecommunication transceiver suitable for Global System for Mobile Communication (GSM), 3G, 3.5G, 4G telecommunication systems, and the like. Through the computer network 2812, the processing unit 2802 can gain access to one or more storages i.e. data storages, databases, data servers and the like connectable to the computer network 2812 to retrieve and/or store data in the one or more storages.

The processing unit 2802 may include a processor 2818, a Random Access Memory (RAM) 2820 and a Read Only Memory (ROM) 2822. The processing unit 2802 may also include a number of Input/Output (I/O) interfaces, for example I/O interface 2838 to the computer mouse 2836, a memory card slot 2816, I/O interface 2824 to the display device 2808, and I/O interface 2826 to the keyboard/keypad 2804.

The components of the processing unit 2802 typically communicate via an interconnected bus 2828 and in a manner known to the person skilled in the relevant art.

The computer programs may be supplied to the user of the processor 2802 encoded on a data storage medium such as a CD-ROM, on a flash memory carrier or a Hard Disk Drive, and are to be read using a corresponding data storage medium drive of a data storage device 2830. Such computer or application programs may also be downloaded from the computer network 2812. The application programs are read and controlled in its execution by the processor 2818. Intermediate storage of program data may be accomplished using RAM 2820.

In more detail, one or more of the computer or application programs may be stored on any non-transitory machine- or computer-readable medium. The machine- or computer-readable medium may include storage devices such as magnetic or optical disks, memory chips, or other storage devices suitable for interfacing with a general purpose computer. The machine- or computer-readable medium may also include a hard-wired medium such as that exemplified in the Internet system, or wireless medium such as that exemplified in the Wireless LAN (WLAN) system and the like. The computer program when loaded and executed on such a general-purpose computer effectively results in an apparatus that implements the steps of the computing methods in examples herein described.

Many modifications and other examples can be made to the apparatus and method for feeding electronic components for insertion onto circuit boards by those skilled in the art having the understanding of the above described disclosure together with the drawings. Therefore, it is to be understood that the apparatus and method for feeding electronic components for insertion onto circuit boards is not to be limited to the above description contained herein only, and that possible modifications are to be included in the claims of the disclosure.

What is claimed is:

1. An apparatus for feeding electronic components for insertion onto circuit boards, the apparatus comprising: a moveable conveyor; a machine for handling insertion of the electronic components onto circuit boards; one or more holding lots in a pallet residing in the machine; a vibratory bowl configured for receiving electronic components and for lining up the electronic components onto the moveable conveyor, the vibratory bowl is configured for vibrating and guiding each of the electronic components towards an opening in the vibratory bowl where each of the electronic components is transferred to the conveyor; a component processing unit comprising:
a plurality of probes disposed along the conveyor configured for checking operation of each of the electronic components lined up along the conveyor by probing leads of each of the electronic components; and
a reject station disposed adjacent to the probes for removing any defective electronic component failing the operation check by dropping the defective electronic component into a receiver of defective electronic component; and
a component feeder configured for transferring each of the electronic components that are non-defective to the machine for handling insertion of the electronic components onto circuit boards; wherein the component feeder is configured for picking up each of the non-defective electronic components and moving one by one each of the electronic components into the one or more holding lots in the pallet residing in the machine.

2. The apparatus as claimed in claim 1, the vibratory bowl comprising one or more filters configured to allow the electronic components with non-defective shape to move through the one or more filters and to disallow the electronic components with defective shape to move through the filter.

3. The apparatus as claimed in claim 2, the one or more filters comprising a gap configured to allow the electronic components with non-defective shape to move through the gap and disallow the electronic components with defective shape to move through the gap.

4. The apparatus as claimed in claim 2, the one or more filters comprising a projection ending with a shape conforming to contours of each of the electronic components, the projection being projected towards a track on which each of the electronic components has to pass, wherein the electronic components with non-defective shape are able to move through a gap between the projection and the track but the electronic components with defective shape are unable to move through the gap between the projection and the track.

5. The apparatus as claimed in claim 1, wherein the component processing unit is configured for determining orientation of each of the electronic components and for orientating one of the electronic components into a predetermined orientation when the determined orientation of said one of the electronic components is not in the predetermined orientation.

6. The apparatus as claimed in claim 1, the component processing unit comprising:
a first checker having a positive polarity probe and a negative polarity probe of the plurality of probes, the first checker being configured such that the positive polarity probe engages a first extending lead of each of the electronic components and the negative polarity probe engages a second extending lead of the same electronic component to check whether polarities of the first extending lead and the second extending lead matches polarities of the positive polarity probe and the negative polarity probe respectively; and
a second checker having a positive polarity probe and a negative polarity probe of the plurality of probes, the second checker being configured such that the positive polarity probe of the second checker engages the second extending lead of the same electronic component and the negative polarity probe of the second checker engages the first extending lead of the same electronic component to check whether polarities of the first extending lead and the second extending lead matches polarities of the negative polarity probe of the second checker and the positive polarity probe of the second checker respectively.

7. The apparatus as claimed in claim 6, wherein one of the first checker or the second checker is predetermined to be an orientation checker for a predetermined orientation of the electronic components, and in the case of detection of failed polarities matching of one of the electronic components by the orientation checker, the component processing unit is activated to orientate said one of the electronic components into the predetermined orientation.

8. The apparatus as claimed in claim 1, the apparatus comprising:
a second moveable conveyor for transferring each of the electronic components at a location of the component processing unit to a location of the component feeder.

9. The apparatus as claimed in claim 8, wherein the second moveable conveyor is incorporated as part of the machine for handling insertion of the electronic components onto circuit boards.

10. The apparatus as claimed in claim 1, the apparatus comprising:
one or more sensors for triggering a signal to pause vibration of the vibratory bowl when a location on the conveyor is detected to have presence of components for a period of time.

11. The apparatus as claimed in claim 8, the apparatus comprising:
one or more sensors for triggering a signal to pause transferring of the components from the component processing unit to the second conveyor when a location on the second conveyor is detected to have presence of components for a period of time.

12. The apparatus as claimed in claim 10, wherein the one or more sensors comprises a beam emitter and a beam receiver, and the signal is triggered when a beam projected from the beam emitter to the beam receiver is blocked by one of the electronic components at the location along the conveyor for the period of time.

13. The apparatus as claimed in claim 11, wherein the one or more sensors comprises a beam emitter and a beam receiver, and the signal is triggered when a beam projected from the beam emitter to the beam receiver is blocked by one of the electronic components at the location along the second conveyor for the period of time.

14. The apparatus as claimed in claim 1, wherein the pallet comprises one or more holding lots for holding different types of the electronic components and the component feeder is configured for transferring, a different type at a time, each of the electronic components to each of the holding lots in the pallet.

15. The apparatus as claimed in claim 1, the apparatus comprising:
more than one of the vibratory bowl.

16. The apparatus as claimed in claim 15, wherein the more than one of the vibratory bowl are arranged in a row and located adjacent to one another.

17. The apparatus as claimed in claim 15, wherein each of the vibratory bowls handles a different type of the electronic components from the type of the electronic components of another one of the vibratory bowls.

18. The apparatus as claimed in claim 1, wherein each of the electronic components is a Light Emitting Diode.

19. The apparatus as claimed in claim 1, wherein the apparatus comprises a taped component feeder for feeding components packaged on a tape.

20. A method for feeding electronic components for insertion onto circuit boards, the method comprising:
receiving electronic components into a vibratory bowl; vibrating the vibratory bowl to guide each of the electronic components towards an opening in the vibratory bowl; lining up the electronic components from the opening onto a moveable conveyor;
checking operation of each of the electronic components lined up along the conveyor;
removing any defective electronic component failing the operation check; transferring each of the electronic components that are non-defective to a machine for handling insertion of the electronic components onto circuit boards; picking up each of the non-defective electronic components;
moving one by one each of the non-defective electronic components into one or more holding lots in a pallet residing in the machine for handling insertion of the non-defective electronic components onto circuit boards and inserting the non-defective electronic components onto the circuit boards.

21. The method as claimed in claim 20, the method comprising:
filtering the electronic components in the vibratory bowl to allow the electronic components with non-defective shape to move to the opening and to disallow the electronic components with defective shape to move to the opening.

22. The method as claimed in claim 21, the method comprising:
subjecting the electronic components to pass through a gap configured to allow the electronic components with non-defective shape to move through the gap and disallow the electronic components with defective shape to move through the gap.

23. The method as claimed in claim 21, the method comprising:
subjecting the electronic components to pass through a gap formed between a projection projected towards a track and the track on which each of the electronic components has to pass, the projection ending with a shape conforming to contours of each of the electronic components, wherein the electronic components with non-defective shape are able to move through the gap but the electronic components with defective shape are unable to move through the gap.

24. The method as claimed in claim 20, the method comprising:
determining orientation of each of the electronic components; and
orientating one of the electronic components into a predetermined orientation when the determined orientation of said one of the electronic components is not in the predetermined orientation.

25. The method as claimed in claim 20, the method comprising:
checking using a first checker having a positive polarity probe and a negative polarity probe, the first checker being configured such that the positive polarity probe engages a first extending lead of each of the electronic components and the negative polarity probe engages a second extending lead of the same electronic component to check whether polarities of the first extending lead and the second extending lead matches polarities of the positive polarity probe and the negative polarity probe respectively; and
checking using a second checker having a positive polarity probe and a negative polarity probe, the second checker being configured such that the positive polarity probe of the second checker engages the second extending lead of the same electronic component and the negative polarity probe of the second checker engages the first extending lead of the same electronic component to check whether polarities of the first extending lead and the second extending lead matches polarities of the negative polarity probe of the second checker and the positive polarity probe of the second checker respectively.

26. The method as claimed in claim 25, the method comprising:
predetermining one of the first checker or the second checker to be an orientation checker for a predetermined orientation of the electronic components; and
orientating said one of the electronic components into the predetermined orientation in the case of detection of failed polarities matching of one of the electronic components by the orientation checker.

27. The method as claimed in claim 20, the method comprising:
transferring using a second moveable conveyor each of the electronic components at a location of the component processing unit to a location of the component feeder.

28. The method as claimed in claim 27, the method comprising:
incorporating the second moveable conveyor as part of the machine for handling insertion of the electronic components onto circuit boards.

29. The method as claimed in claim 20, the method comprising:
triggering a signal to pause vibration of the vibratory bowl when a location on the conveyor is detected to have presence of components for a period of time.

30. The method as claimed in claim 27, the method comprising:
triggering a signal to pause transferring of the components from the component processing unit to the second conveyor when a location on the second conveyor is detected to have presence of components for a period of time.

31. The method as claimed in claim 29, the method comprising:
triggering the signal when a beam projected from the beam emitter to the beam receiver is blocked by one of the electronic components at the location along the conveyor for the period of time.

32. The method as claimed in claim 30, the method comprising:
triggering the signal when a beam projected from the beam emitter to the beam receiver is blocked by one of the electronic components at the location along the second conveyor for the period of time.

33. The method as claimed in claim 1, wherein the pallet comprises one or more holding lots for holding different types of the electronic components and the method comprising:
   transferring, a different type at a time, each of the electronic components to each of the holding lots in the pallet.

34. The method as claimed in claim 20, the method comprising:
   using more than one of the vibratory bowl.

35. The method as claimed in claim 34, the method comprising:
   arranging the more than one of the vibratory bowl are in a row and locating the more than one of the vibratory bowl adjacent to one another.

36. The method as claimed in claim 34, the method comprising:
   handling a different type of the electronic components for each of the vibratory bowls from the type of the electronic components of another one of the vibratory bowls.

37. The method as claimed in claim 20, wherein each of the electronic components is a Light Emitting Diode.

38. The method as claimed in claim 20, the method comprising:
   feeding components packaged on a tape to the machine for handling insertion of the electronic components onto circuit boards using a taped component feeder.

* * * * *